US012618924B2

(12) United States Patent 
Hai et al.

(10) Patent No.: US 12,618,924 B2 
(45) Date of Patent: May 5, 2026

(54) FABRICATION AND USE OF NANOCOILS ON NITROGEN-VACANCY DIAMOND SUBSTRATES FOR MAGNETIC FIELD DETECTION AND MANIPULATION

(71) Applicant: Wisconsin Alumni Research Foundation, Madison, WI (US)

(72) Inventors: Aviad Hai, Madison, WI (US); Alireza Ousati Ashtiani, Madison, WI (US); Ilhan Bok, Madison, WI (US); Yash Sanjay Gokhale, Chicago, IL (US)

(73) Assignee: Wisconsin Alumni Research Foundation, Madison, WI (US)

( * ) Notice: Subject to any disclaimer, the term of this patent is extended or adjusted under 35 U.S.C. 154(b) by 234 days.

(21) Appl. No.: 18/415,808

(22) Filed: Jan. 18, 2024

(65) Prior Publication Data

US 2025/0237723 A1 Jul. 24, 2025

(51) Int. Cl. 
*G01R 33/341* (2006.01) 
*G01R 33/00* (2006.01) 
(Continued)

(52) U.S. Cl. 
CPC ....... *G01R 33/341* (2013.01); *G01R 33/0052* (2013.01); *G01R 33/032* (2013.01); 
(Continued)

(58) Field of Classification Search 
CPC ................ G01R 33/341; G01R 33/032; G01R 33/1284; G01R 33/26; G01R 33/323; G01R 33/02; G01R 33/0052; G01R 33/34007 
See application file for complete search history.

(56) References Cited

U.S. PATENT DOCUMENTS 9,823,313 B2 11/2017 Hahn 
2017/0343618 A1* 11/2017 Hahn ................... G01R 33/032

FOREIGN PATENT DOCUMENTS

WO 2016118791 A1 7/2016

OTHER PUBLICATIONS

Bok, Ilhan, et al. "Nanofabricated high turn-density spiral coils for on-chip electromagneto-optical conversion." Microsystems & Nanoengineering 10.1 (Mar. 25, 2024): 44. (Year: 2024).*

(Continued)

*Primary Examiner* — Rishi R Patel 
(74) *Attorney, Agent, or Firm* — Bell & Manning, LLC

(57) ABSTRACT

Spiral inductors, magnetic field sensors incorporating the spiral inductors, and methods of using the magnetic field sensors are provided. The spiral inductors include an electrically conductive spiral coil and a nitrogen vacancy (NV) diamond substrate. A thin barrier layer of a dielectric material separates the spiral coil from the surface of the NV diamond substrate and an overlayer of dielectric material is disposed over the spiral nanocoil. The integration of the spiral coil with an NV substrate in this manner creates a highly enhanced magnetic transduction and produces a simple, high-performance way to control and read out electromagnetic signals. Because the spiral inductors enable electromagnetic-to-optical signal conversion, they can be used as sensors for environmental or biomedical applications and spin-based computation.

17 Claims, 26 Drawing Sheets 
(10 of 26 Drawing Sheet(s) Filed in Color)

(51) Int. Cl.
| | |
|---|---|
| *G01R 33/032* | (2006.01) |
| *G01R 33/12* | (2006.01) |
| *G01R 33/26* | (2006.01) |
| *G01R 33/32* | (2006.01) |

(52) U.S. Cl.
CPC ......... *G01R 33/1284* (2013.01); *G01R 33/26* (2013.01); *G01R 33/323* (2013.01)

(56) References Cited

OTHER PUBLICATIONS

Qutools. quNV-NV Center Sensing: Quantum Sensing Education Kit. Brochure.

Maze, Jeronimo R., Paul L. Stanwix, James S. Hodges, Seungpyo Hong, Jacob M. Taylor, Paola Cappellaro, Liang Jiang et al. "Nanoscale magnetic sensing with an individual electronic spin in diamond." Nature 455, No. 7213 (2008): 644-647.

Budker, Dmitry, and Michael Romalis. "Optical magnetometry." Nature physics 3, No. 4 (2007): 227-234.

Chen, Ji, and Juin J. Liou. "On-chip spiral inductors for RF applications: An overview." JSTS: Journal of Semiconductor Technology and Science 4, No. 3 (2004): 149-167.

Sikder, Md Kabir Uddin, James Fallon, Mohit N. Shivdasani, Kumaravelu Ganesan, Peter Seligman, and David J. Garrett. "Wireless induction coils embedded in diamond for power transfer in medical implants." Biomedical microdevices 19 (2017): 1-10.

Phillips, Jack, Mitchell Glodowski, Yash Gokhale, Matthew Dwyer, Alireza Ashtiani, and Aviad Hai. "Enhanced magnetic transduction of neuronal activity by nanofabricated inductors quantified via finite element analysis." Journal of neural engineering 19, No. 4 (2022): 046003.

Le, Hoa Thanh, Rubaiyet I. Haque, Ziwei Ouyang, Seung Woo Lee, Shelley I. Fried, Ding Zhao, Min Qiu, and Anpan Han. "MEMS inductor fabrication and emerging applications in power electronics and neurotechnologies." Microsystems & nanoengineering 7, No. 1 (2021): 59.

Levine, Edlyn V., Matthew J. Turner, Pauli Kehayias, Connor A. Hart, Nicholas Langellier, Raisa Trubko, David R. Glenn, Roger R. Fu, and Ronald L. Walsworth. "Principles and techniques of the quantum diamond microscope." Nanophotonics 8, No. 11 (2019): 1945-1973.

* cited by examiner

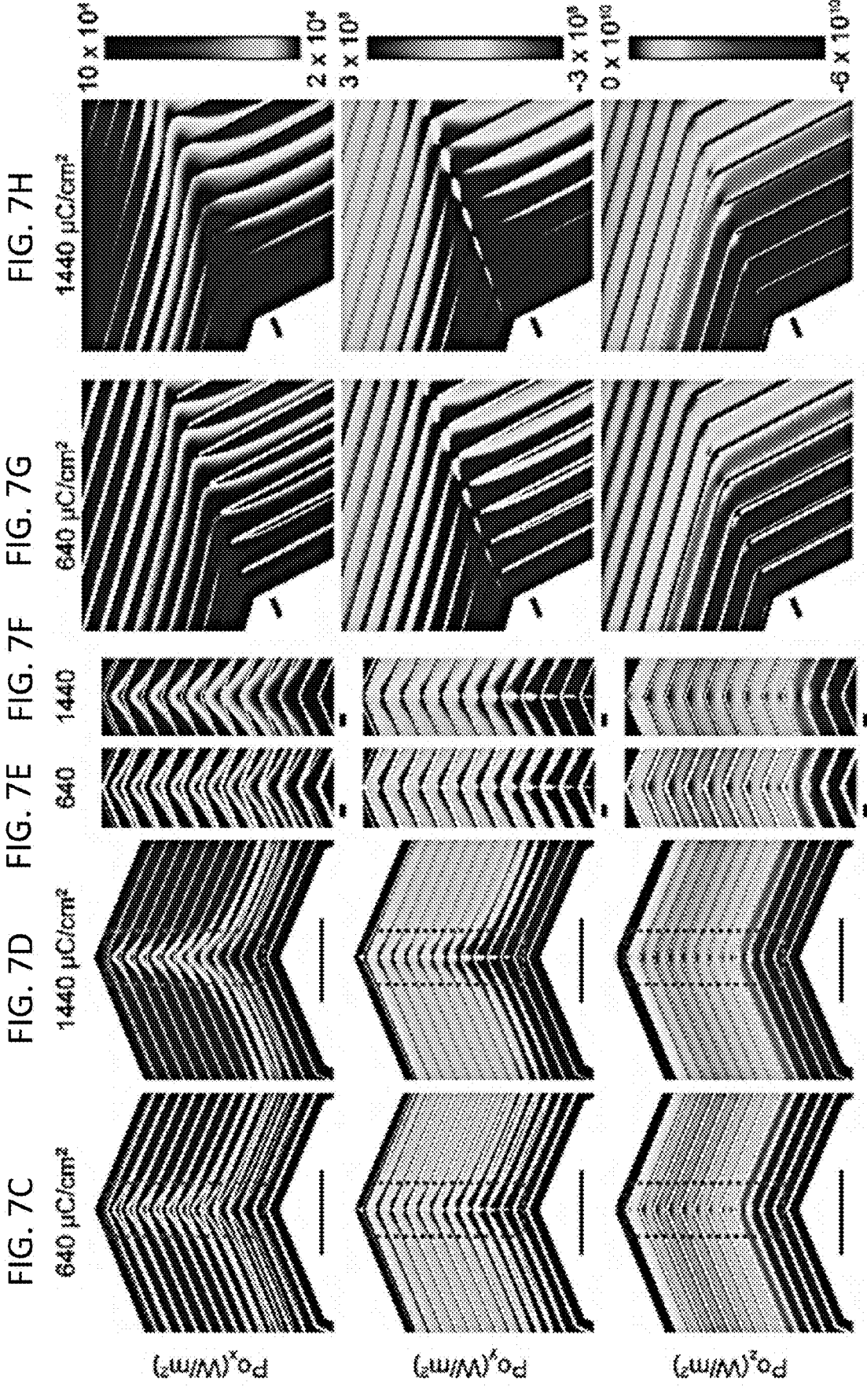

FIG. 8A

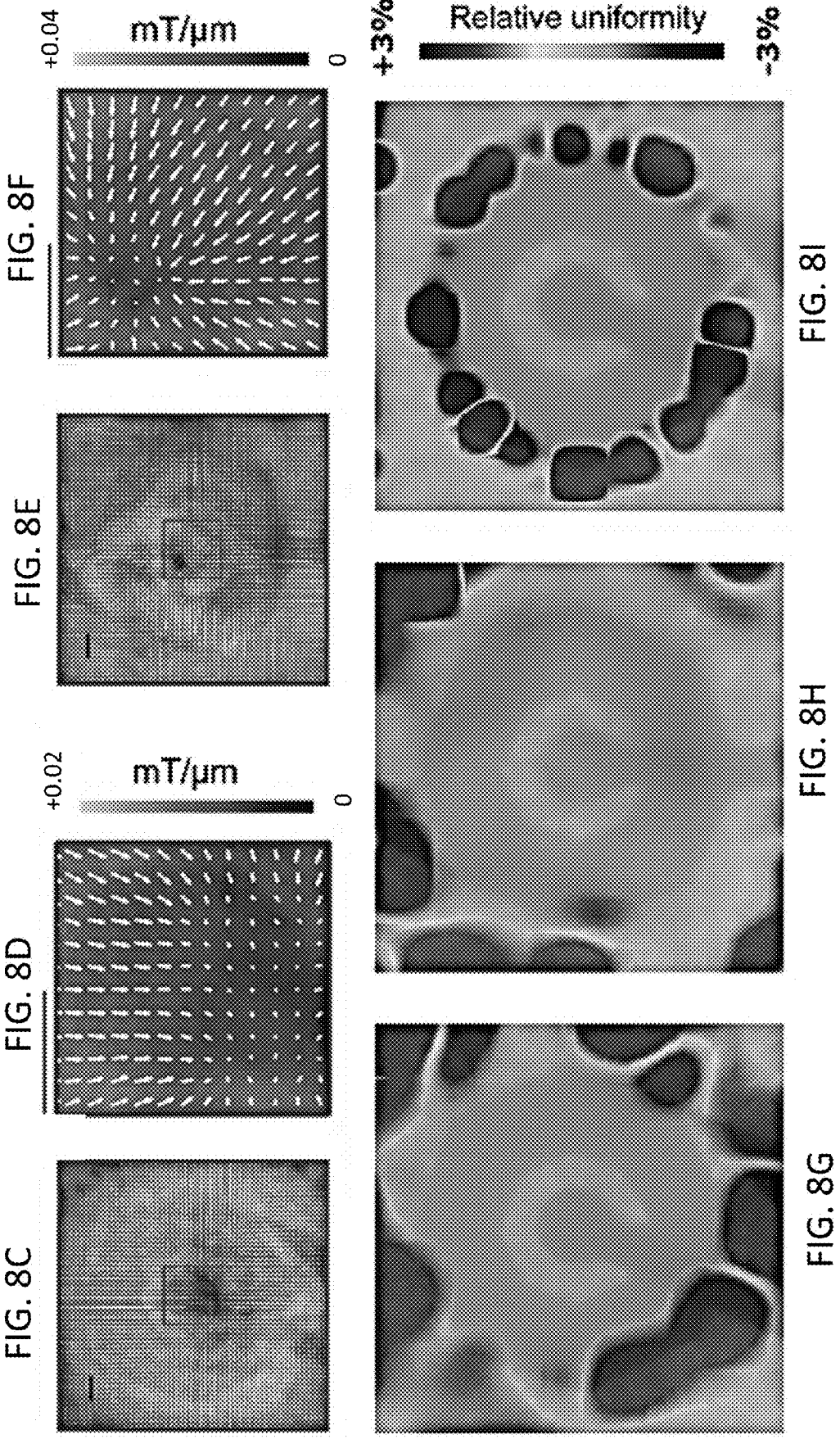

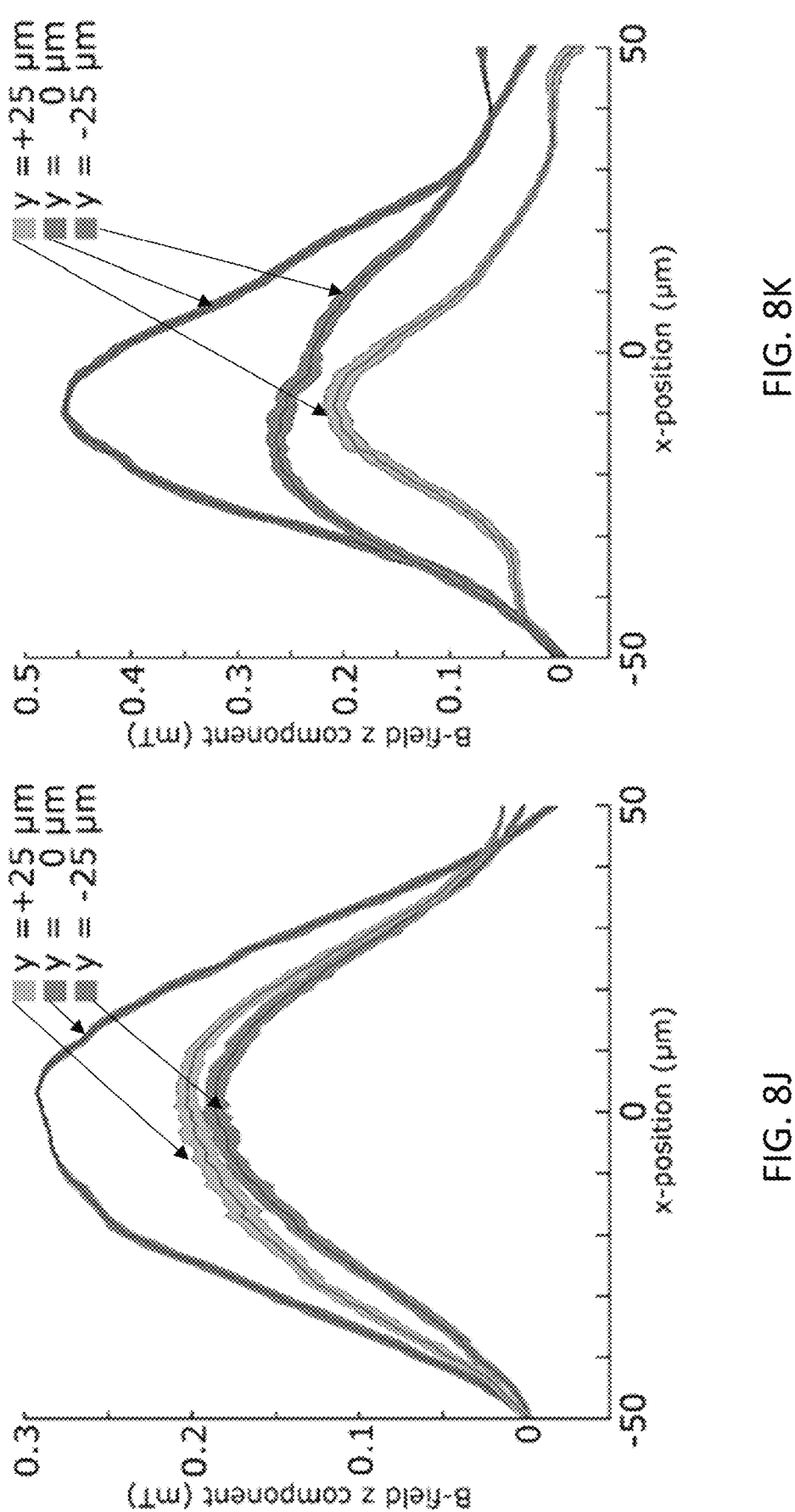

FABRICATION AND USE OF NANOCOILS ON NITROGEN-VACANCY DIAMOND SUBSTRATES FOR MAGNETIC FIELD DETECTION AND MANIPULATION

REFERENCE TO GOVERNMENT RIGHTS

This invention was made with government support under NS122605 awarded by the National Institutes of Health. The government has certain rights in the invention.

BACKGROUND

On-chip micro- and nano-fabricated inductors, antennas, and electromagnets extend possibilities for compartmentalizing a wide variety of technologies and research applications. From wireless communication, high frequency signal conversion, power transfer and filtering, to environmental and biological sensing-new designs are leveraging diverse geometries and material compositions to transform electromagnetic energy at a broad spatiotemporal range. Specific lab-on-chip platforms for magnetic detection and manipulation rely on patterned coils and loops for optical magnetometry, nuclear magnetic resonance (NMR) spectroscopy and imaging, magnetic particle separation, molecular magnetophoresis, and cell manipulation and labelling. Theoretical limitations and fabrication constraints restrict performance and are closely related to quality factor, frequency bandwidth, and temporal response. More recent innovative devices demonstrate improved properties by utilizing approaches such as three-dimensional fabrication, mechanically self-assembled coils, air-core or air-suspended coils, and the use of alternative materials such as graphene, carbon, ZnO, and others. However, the integration of complex designs into standard fabrication processes is not trivial. Consequently, metal-based flat spiral coils remain the mainstay devices for on-chip electromagnetic signal conversion owing to a relatively small number of lithography steps and higher structural and thermal stability. Spiral inductors are integrated in a myriad of recent applications including power harvesting components on flexible and bioresorbable electronic sensors, recording and stimulation devices for wireless neurological applications, and ingestible electroceuticals. Additionally, they empower modalities such as nuclear magnetic resonance (NMR) and biomedical magnetic resonance imaging (MRI) by providing high spatial resolution microprobes for spectroscopy and imaging.

While most systems employ microlithography to pattern coil structures, a small number of studies began exploring nano-scale lithography to propel spatial features while maximizing performance. These include electron beam lithography (EBL) for synthesizing meandering inductors with submicron conducting lines, complementary metal-oxide semiconductor (CMOS)-compatible glancing angle physical vapor deposition (GLAD) for vertically aligned nanohelices, and spiral patterns realized via focused ion beam fabrication (FIB). (Stojanovic, G. et al., Scaling Meander Inductors from Micro to Nano. in 2006 *International Semiconductor Conference* vol. 1 93-96 (2006); Seilis, A. et al., IEEE *Transactions on Components, Packaging and Manufacturing Technology* 5, 675-684 (2015); Khorasani, S. A. *Appl. Phys. Lett.* 112, 031906 (2018).) The emerging integration of these methods and other promising nanofabrication techniques with standard CMOS processes, in particular EBL, highlights opportunities for designing novel rapid fabrication processes for high spatial resolution electromagnetic conversion.

SUMMARY

Spiral inductors, methods of fabricating the spiral inductors, magnetic field detectors incorporating the spiral inductors, and methods of using the magnetic field detectors are provided.

One embodiment of a spiral inductor includes: a nitrogen vacancy diamond substrate; a barrier layer of dielectric material on a surface of the nitrogen vacancy diamond substrate; a spiral nanocoil comprising an electrically conductive material on a surface of the barrier layer of dielectric material; an overlayer of dielectric material disposed over the spiral nanocoil; a first electrode contact on a first end of the spiral nanocoil; and a second electrode contact on a second end of the spiral nanocoil.

One embodiment of a magnetic field detector includes: a spiral inductor of a type described herein; an optical excitation source positioned to direct excitation radiation onto the nitrogen vacancy diamond substrate and the nanocoil; and an optical detector positioned to detect a fluorescence signal generated by the nitrogen vacancy diamond.

One embodiment of a method of detecting a magnetic field generated by the spiral nanocoil in a magnetic field detector of a type described herein includes the steps of: directing excitation radiation from the optical excitation source onto the surface of the nitrogen vacancy diamond substrate and the nanocoil, whereby the nitrogen vacancy diamond emits fluorescence having an intensity that is modulated by the magnetic field generated by the spiral nanocoil; and monitoring the fluorescence using the optical detector.

One embodiment of a method of fabricating a spiral inductor includes the steps of: depositing a barrier layer of dielectric material on a surface of a nitrogen vacancy diamond substrate; forming a layer of an electron-beam resist on a surface of the barrier layer of dielectric material; defining a spiral nanocoil pattern in the layer of the electron-beam resist using positive electron-beam lithography; depositing an electrically conductive material in the spiral nanocoil pattern to form a spiral nanocoil comprising the electrically conductive material on the surface of the barrier layer of dielectric material; removing the remaining electron-beam resist from the surface of the barrier layer of dielectric material; depositing an overlayer of dielectric material over the spiral nanocoil; forming a first electrode contact on a first end of the spiral nanocoil; and forming a second electrode contact on a second end of the spiral nanocoil.

Other principal features and advantages of the invention will become apparent to those skilled in the art upon review of the following drawings, the detailed description, and the appended claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Illustrative embodiments of the invention will hereafter be described with reference to the accompanying drawings.

FIG. 2A shows an NV diamond substrate. FIG. 2B shows a 100 nm $SiO_2$ barrier layer on a surface of the NV diamond substrate. FIG. 2C shows a 400 nm PMMA layer spin coated and patterned via EBL to define nanocoil features. FIG. 2D shows a Ti/Au (6/60 nm) bi-layer deposited with e-beam evaporation and subsequent lift-off to create a nanocoil structure shown in FIG. 2E. FIG. 2F shows an additional insulating $SiO_2$ overlayer deposited to prepare for photolithography (PL) micropatterning of electrode routing. FIG. 2G shows via holes 230, 232 defined via PL and etched with a fluorine-based plasma recipe. FIG. 2H shows electrode trace 112, 114 patterning and gold electrodes 116, 118 laid via evaporation and lift-off. While certain dielectric materials, electron-beam resists, metals, layer thicknesses, material deposition, and micropatterning processes are disclosed above and used in the Example, other materials, thicknesses, and deposition, and micropatterning processes can be used.

FIG. 4A shows current density ($A/m^2$). Note that the current density in the device is much higher than in the substrate and dielectric. FIG. 4B shows voltage (V). FIG. 4C shows electrical field (V/m). Note that the field within the device and dielectric is much higher than in the bulk substrate and air surrounding the device. Streamlines are tangent to the vector field representing the electrical field within the model space. FIG. 4D shows magnetic flux (mT), shown on a cross-section of the model space as well as in streamlines around the device. Streamlines are tangent to the vector field representing the magnetic flux within the model space.

FIG. 5A shows a complete view of the end device. The dotted region is portrayed as a scanning electron microscopy (SEM) image of the EBL step in the left inset, showing distinct uniformity of turns for a dose of 1120 $\mu C/cm^2$ (scale bar=5 $\mu m$). Different doses with closest corresponding AFM traces are shown in FIG. 5B: 960 $\mu C/cm^2$ (left), 1280 $\mu C/cm^2$ (center), and 1600 $\mu C/cm^2$ (right; scale bar=5 $\mu m$), with corresponding 3-dimensional AFM traces arranged by height (insets). FIG. 5C shows a single pixel Monte Carlo simulation of PMMA exposure where 1 Gy≡7.366 $eV/cm^3$ and FIG. 5D shows corresponding triple turn simulation arranged by particle trajectory height. The different layers correspond to gold, PMMA, and quartz. FIG. 5E shows average turn widths and gap widths versus dose, determined using atomic force microscopy, showing a linear relationship between dose and feature size. Shown at right is a matrix comparing (FIG. 5F) single-pixel Monte Carlos, (FIG. 5G) multi-turn Monte Carlos (FIG. 5H) (with zoomed regions of interest), (FIG. 5I) PMMA pre-liftoff (FIG. 5J) (with close-up ROIs), and (FIG. 5K) Ti/Au post-liftoff (FIG. 5L) (with closeup ROIs), respectively. Columns from left to right correspond to doses of 320, 480, 640, 800, 960, 1120, 1280, 1440, and 1600 $\mu C/cm^2$, respectively (scale bar=500 nm (overview panels) or 100 nm (zoomed ROIs)).

FIG. 6A shows that finite element analysis reveals slope trends in agreement with AFM and SEM measurements. Inset shows an example support vector machine (SVM) regression of PMMA slope. Dots represent mesh points with subthreshold and suprathreshold exposure. The solid line and dashed lines represent the optimal hyperplane and margin, respectively. FIG. 6B shows whole-coil resistance and FIG. 6C shows parasitic inter-turn capacitance. Wheeler method and sheet spiral inductance calculations are shown in FIG. 6D, with the corresponding self-resonance (FIG. 6E) and Q factor (FIG. 6F). All quantities are plotted versus electron beam dose ranging from 640 to 1440 $\mu C/cm^2$ except for SEM data which extends to 1600 $\mu C/cm^2$. Comparing the impedance in decibel ohms to linear frequency reveals a dose-dependent tuning curve (FIG. 6G) with varying resonant frequency and Q factor (inset).

FIGS. 7A-7I show dose-dependent power dissipation quantification and analysis in accordance with the Example. FIG. 7A shows a full view of the nanocoil (dose: 640 $\mu C/cm^2$) with coil surface arranged by x-component of the Poynting vector ($Po_x$) and plane of coil arranged by magnetic energy density ($J/m^3$). The dashed box shows the regions expanded in FIGS. 7G and 7H. Inset: subtraction histogram between high dose (1440 $\mu C/cm^2$) and low dose (640 $\mu C/cm^2$) vector count versus angle, color-coded by magnitude. FIG. 7B shows vector magnitude for the integral of X, Y, and Z components $\| \oiint_{coil} Po_x \; \hat{x} + \oiint_{coil} Po_y \; \hat{y} + \oiint_{coil} Po_z \; \hat{z} \|$ over the entire coil surface of dissipated power versus doses examined with lines of best fit affirming a linear trend between electron beam dose-dependent turn width and dissipated power. FIGS. 7C-7H: Two-dimensional (2D) Poynting vector x ($Po_x$), y ($Po_y$) and z ($Po_z$) plots for 640 $\mu C/cm^2$ (FIGS. 7C and 7E) and 1440 $\mu C/cm^2$ (FIGS. 7D and 7F) for dashed box in FIG. 7A (FIGS. 7C and 7D, scale bar=10 $\mu m$) and zoomed inset (dashed boxes, FIGS. 7E and 7F, scale bar=1 $\mu m$). Three-dimensional (3D) plots of corresponding regions for 640 $\mu C/cm^2$ (FIG. 7G, scale bar=1 $\mu m$) and 1440 $\mu C/cm^2$ (FIG. 7H, scale bar=1 $\mu m$). FIG. 7I shows separate surface integrals of the X, Y, and Z components of the Poynting vector, demonstrating linear relationships between electron beam dose-dependent turn width and dissipated power.

FIGS. 8A-8K show optical magnetometry measurements of nanocoil B-field strength during current injection in accordance with the Example. FIGS. 8A and 8B show B-field maps of two different device routing configurations. Top left: reference image with delineated line scans, bottom left: B-field amplitude (0 mA DC), bottom right: B-field amplitude (3 mA DC), top right: current OFF minus current ON subtraction; B-field z component. FIGS. 8C-8F show vector field lines of B-field gradient overlaid on B-field maps. FIGS. 8D and 8F correspond to dashed boxes in FIGS. 8C and 8E, respectively. FIGS. 8G-8H show uniformity maps comprising vector field lines of B-field gradient overlaid on corresponding B-field gradient maps. FIG. 8I shows simulation of uniformity map for comparison. FIGS. 8J-8K show 100 $\mu m$ line scans of B-field z component for FIGS. 8A and 8B, respectively taken at y=+25, 0, −25 $\mu m$ from device center. Scale bars=20 $\mu m$.

DETAILED DESCRIPTION

Spiral inductors, magnetic field sensors incorporating the spiral inductors, and methods of using the magnetic field sensors are provided. The spiral inductors include an electrically conductive spiral nanocoil and a nitrogen vacancy (NV) diamond substrate. A thin barrier layer of a dielectric material separates the spiral nanocoil from the surface of the NV diamond substrate, and an overlayer of dielectric material is disposed over the spiral nanocoil. Integrating the spiral nanocoil with an NV substrate in this manner creates a highly enhanced magnetic transduction, relative to that offered by other existing technologies, and produces a simple, high-performance way to control and read out electromagnetic signals. Moreover, because the spiral inductors enable electromagnetic-to-optical signal conversion, they have a variety of useful applications, including sensors for environmental or biomedical applications and spin-based computation.

Figure 1A:
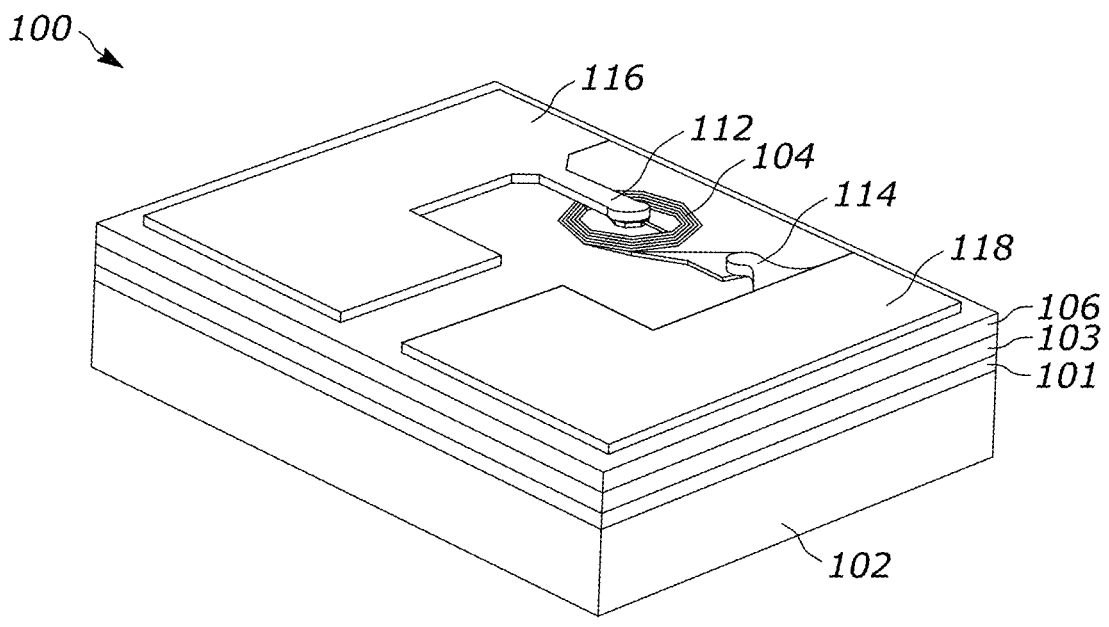
FIG. 1A is a schematic diagram of a spiral inductor comprising an electrically conductive nanocoil and an NV diamond substrate.
Figure 1B:
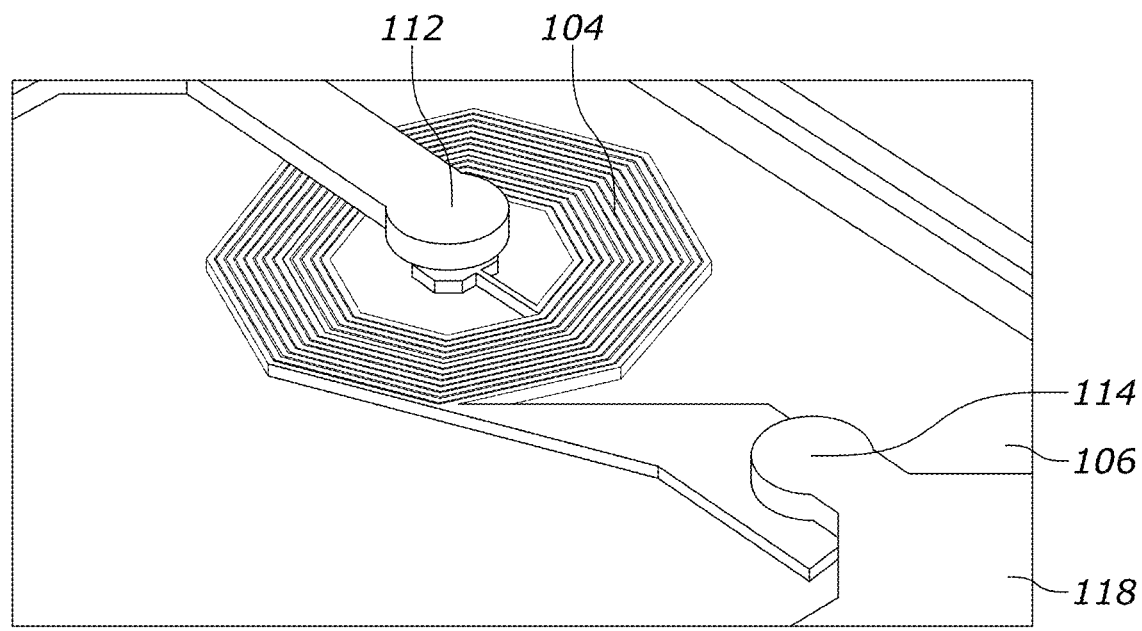
FIG. 1B is an enlarged view of the nanocoil of the spiral inductor of FIG. 1A.

One example of a spiral inductor is shown schematically in FIGS. 1A and 1B. A spiral inductor 100 includes an NV diamond substrate 102 in which at least a surface region 101 comprises NV centers and a spiral nanocoil 104 that is separated from the NV diamond substrate surface by a dielectric barrier layer 103. The spiral inductor further includes a dielectric overlayer 106 over spiral nanocoil 104, a first electrode contact 108, and a second electrode contact 110 that enable the ends of spiral nanocoil 104 to be connected to external circuitry.

Figure 2A:
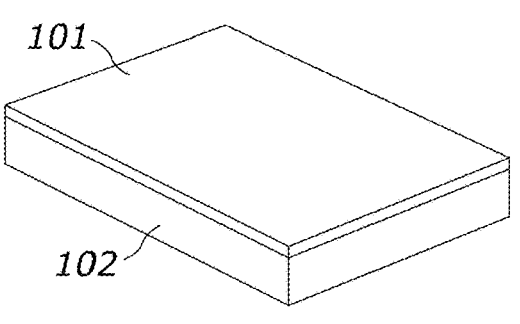
FIGS. 2A-2H show an EBL fabrication process for a spiral inductor.

The spiral nanocoils can be fabricated using a simple electron-beam lithography (EBL) process that relies on electron-beam (e-beam) dose control to achieve conducting nanocoils for nanoscale dimensions and high turn-densities. The schematic illustrations of FIGS. 2A-2H illustrate the EBL process for fabricating a spiral inductor on NV diamond. The process begins with an NV diamond substrate 102. NV diamond is diamond that is characterized by defects in which a carbon atom in the crystal lattice is replaced by a nitrogen atom and a vacancy in an adjacent lattice site. These defects, which are referred to as nitrogen-vacancy centers (NV centers), provide NV diamond with unique quantum properties, including electron spins that are highly sensitive to external magnetic fields and that can be manipulated and controlled at room temperature (~23° C.). More detailed description of NV diamond, including methods of making NV diamond, can be found in the literature. (See, for example, Grinolds, M. S. et al., Nature Phys. 9, 215-219 (2013); and Aslam, N. et al., Nat. Rev. Phys. 5, 157-169 (2023).) While the NV diamond substrate may be a bulk NV diamond substrate (e.g., a diamond wafer with NV centers), as shown in FIG. 2A it may also comprise a layer of NV diamond on an underlying support substrate.

Figure 2B:
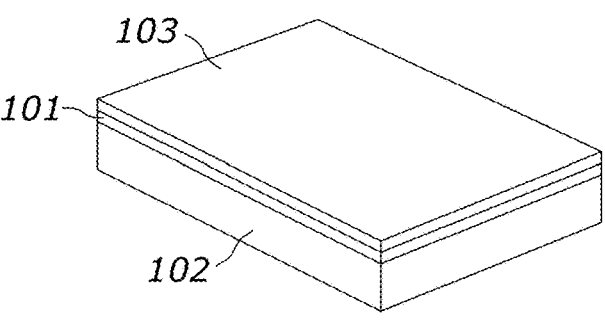

A thin barrier layer 103 of dielectric material is deposited on NV diamond substrate 102 (FIG. 2B). Barrier layer 103 protects the underlying diamond, provides electrical isolation and adhesion between the spiral nanocoil and NV diamond 102. Moreover, barrier layer 103 may be a sacrificial layer formed from a dielectric material that can be selectively removed using, for example, a wet or dry etch. This makes it possible to reuse NV diamond substrate 102 by separating NV diamond substrate 102 from spiral nanocoil 104 and dielectric overlayer 106, once the spiral inductor has reached the end of its useful life. Examples of suitable dielectric materials for barrier layer 103 include, but are not limited to, silicon oxides (e.g., silicon dioxide; $SiO_2$), silicon nitrides (e.g., $Si_3N_4$), silicon oxynitride, and tetraethylorthosilicate (TEOS). Silicon oxide can be selectively etched using a liquid etchant, such as hydrofluoric acid (HF), or a vapor-phase etchant, such as HF vapor. Silicon nitrides can be selectively etched using $SF_6$/He or $CH_3F/O_2/N_2$.

Barrier layer 103 should be sufficiently thin so that it does not measurably interfere with the coupling between a magnetic field generated at the center of spiral coil 104 and NV centers in NV diamond substrate 102 (as discussed in greater detail below). Thus, barrier layer 103 typically has a thickness of no greater than 5 μm and, more typically, no greater than 1 μm. By way of illustration only, dielectric barrier layers having a thickness in the range from 10 nm to 5 μm, including in the range from 50 nm to 1 μm, can be used. Examples of deposition processes that can be used to deposit the dielectric barrier layer on the surface of an NV diamond substrate include plasma-enhanced chemical vapor deposition (PECVD), atomic layer deposition (ALD), or thin-film transfer printing techniques.

Figure 2C:
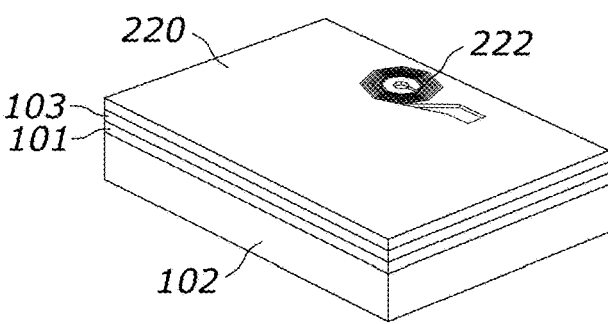

A layer of e-beam resist 220 is deposited onto barrier layer 103 and a spiral nanocoil pattern 222 is defined in e-beam resist 220 via positive e-beam lithography (FIG. 2C). Suitable positive e-beam resist materials include poly(methyl methacrylate) (PMMA), styrene methyl acrylate-based photoresists (ZEP type photoresist), and ARP type photoresists. An electrically conductive material 224 is then deposited over the e-beam resist (FIG. 2D), followed by the removal of the e-beam resist with metal lift-off (FIG. 2E), leaving an electrically conductive spiral nanocoil 104 with a first (interior) electrode contact 108 and a second (exterior) electrode contact 110 on the surface of barrier layer 103.

The spiral nanocoil is desirably characterized by a high fill-factor, a high coil turn density, and one or more nanoscale dimensions. As used herein, the term nanocoil is used to refer to a coil having a turn spacing (i.e., inter-turn spacing) of 1000 nm or less. The use of e-beam dose-control during the EBL process makes it possible to fabricate nanocoils with nanoscale turn spacings and turn widths and constant turn densities. E-beam dose-control for the fabrication of high-turn-density nanocoils is illustrated in the Example below. The ability to accurately control the dimensions of the nanocoils enables the coil impedance and turn density to be adapted to the current range expected during the use of the spiral inductor. This reduces or eliminates ohmic loss and localized heating and improves sensor accuracy. Additionally, e-beam dose control can be used to produce evenly spaced coil turns to provide constant inductance. Using EBL with dose control, spiral nanocoils having a maximum outer (edge-to-edge) diameter of 100 μm or lower, a thickness of 100 nm or lower, and turn spacings of 500 nm or lower can be formed. This includes embodiments of the spiral nanocoils having turn spacings in the range from 150 nm to 400 nm and corresponding turn widths (w) in the range from 1300 nm to 1100 nm. However, nanocoils having outer diameters, thicknesses, turn spacings, and/or turn widths outside of these ranges can be fabricated and used.

In the Example below, EBL with dose control is illustrated using PMMA as an e-beam resist. However, e-beam dose control for the fabrication of nanocoils can be carried out using other resist materials. While the optimal dosage ranges may vary depending on the particular resist material being used, the information provided in the Example can be used as guidance in identifying workable and optimal e-beam dosages for other resist materials. Additionally, while the turns in the spiral coil in the Example and in FIGS. 1A-1B and FIGS. 2A-2H are octagonal in shape, other turn shapes, including other polygon shapes (e.g., hexagonal shapes), circular shapes, and square shapes can be used.

Metals are good candidates for electrically conductive material 224. Metals include metal alloys. In some embodiments of the nanocoils, electrically conductive material 224 comprises a stack of two or more metal sublayers. By way of illustration only, the electrically conductive material may be gold (Au), copper (Cu), platinum (Pt), chromium (Cr), silver (Ag), or aluminum (Al), or a bilayer of titanium (Ti) and gold (Ti/Au), chromium and titanium (Cr/Ti), or silver and titanium (Ag/Ti). Alternatively, the electrically conductive material may comprise a layer of titanium sandwiched between two non-titanium metal layers, which may the same or different and may be, for example, a metal listed above. Metals can be deposited by, for example, evaporation or sputtering.

Figure 2D:
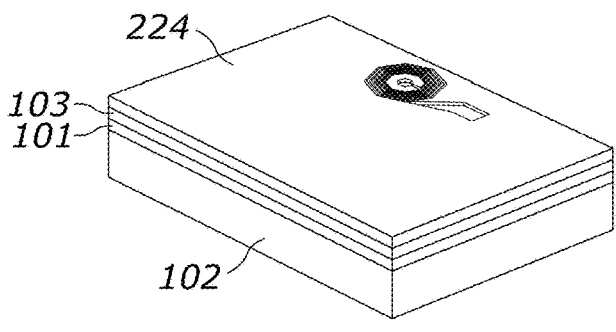
Figure 2E:
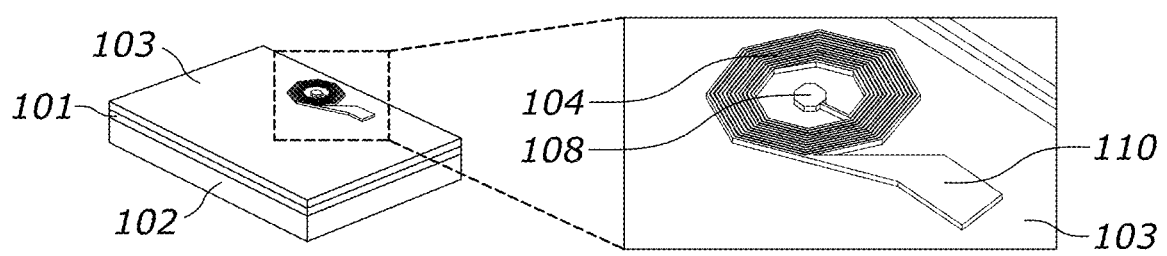
Figure 2F:
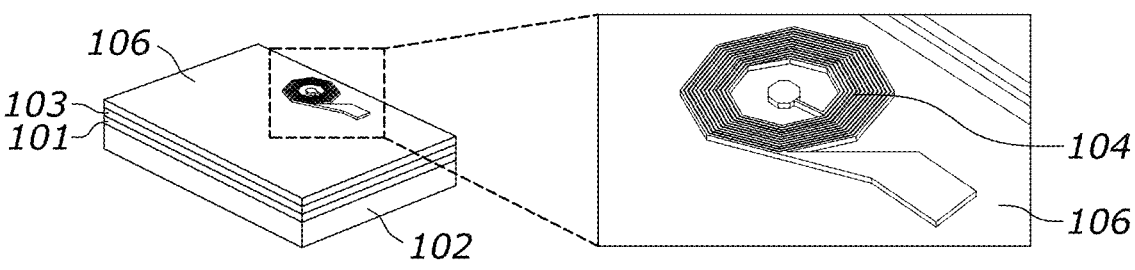
Figure 2G:
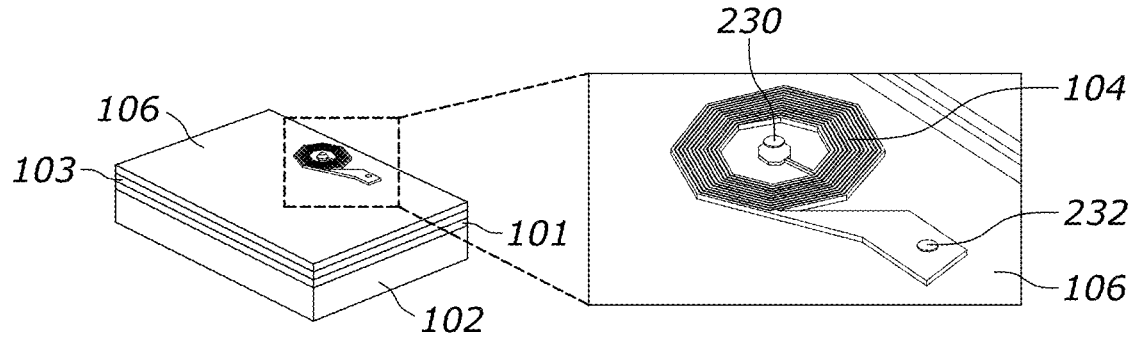
Figure 2H:
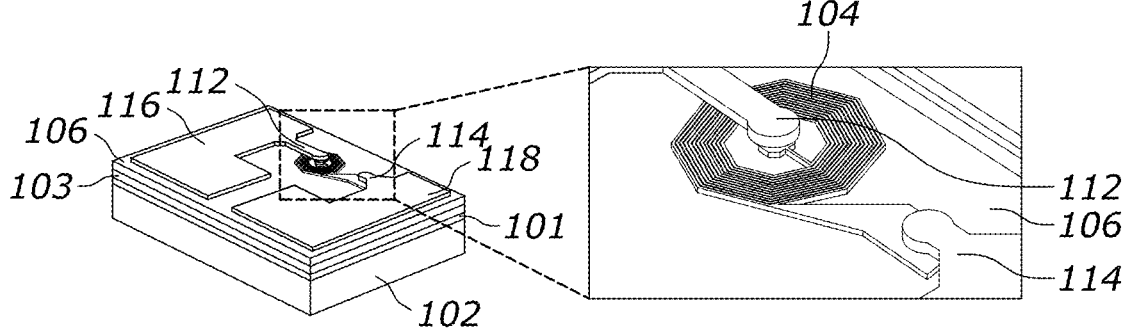

Once spiral nanocoil 104 is fabricated, an overlayer of dielectric material 106 is deposited over spiral nanocoil 104 (FIG. 2F), via holes 230, 232 are then defined in dielectric material 106 (FIG. G), and electrode traces and electrodes are formed (FIG. 2H). The dielectric material of overlayer 106 may be the same as or different from the dielectric material of barrier layer 103 and may be deposited using known methods, such as PECVD. The electrode traces and electrodes comprise an electrically conductive material, typically a metal. The metal of the electrode traces and electrodes can be formed using known methods, such as optical microlithography.

Because the NV centers in NV diamond are fluorescent point defects, the spiral inductors can be used as highly sensitive magnetic field sensors. In a magnetic field sensor, a magnetic field is produced at the center of the nanocoil in response to a current running through the nanocoil, and this magnetic field changes in response to changes in the potential driving the current. In practice, the potential driving the current in the nanocoil may originate from a variety of sources, including biological processes and environmental sources. By way of illustration only, the potential may be generated by a biological process, such an action potential produced by a biological cell. When this magnetic field interacts with the NV diamond, the effect of the magnetic field on the electron spins of the NV centers changes the fluorescence response of the NV diamond. In this manner, the spiral inductors transduce an electromagnetic signal to an optical signal. Notably, the intensity of the magnetic field generated in the nanocoil may be substantially enhanced (e.g., by a factor of at least 2, at least 3, or more) relative to an intrinsic magnetic field produced by the source of the driving current, and this enhancement in magnetic field intensity can be harnessed for highly sensitive magnetic field detection with optical read-out in a magnetic field detector.

While magnetic field detectors incorporating the spiral inductors may have various designs, the core components are: an NV-diamond-based spiral inductor of a type described herein; an optical excitation source positioned to direct excitation radiation on the NV diamond substrate and the nanocoil; and an optical detector positioned to detect a fluorescence signal generated by the NV diamond. Suitable optical excitation sources include lasers and light-emitting diodes. Visible light, particularly green light (i.e., visible radiation having wavelengths in the range from 500 to 600 nm), is an example of excitation radiation that can induce optical excitation of NV diamond. Optical detectors include photon detectors that detect visible light, particularly red light (i.e., visible radiation having wavelengths in the range from about 620 nm to 750 nm). Optics systems that include lenses, reflectors, filters and/or apertures may be positioned between the NV diamond substrate and the optical excitation source to direct the excitation radiation onto the NV diamond and/or between the NV diamond substrate and the optical detector to direct fluorescence generated from the NV centers in the diamond to the optical detector. In some embodiments of the magnetic field detectors, sensor chips of one or more Complementary Metal-Oxide-Semiconductor (CMOS) cameras are used as the optical detector. Other suitable optical detectors include charge-coupled devices (CCDs), single-photon avalanche diodes (SPADs), and electron-multiplying charge-coupled devices (EMCCDs). Because the magnetic field detectors have such small footprints, they can be integrated into small detector devices, including mobile detectors.

One type of magnetic field detector into which the NV-diamond-based spiral inductors can be incorporated is an Optically Detected Magnetic Resonance (ODMR) magnetometer. In an ODMR, optical, magnetic, and microwave fields are applied to manipulate the spin-state populations in the NV centers of NV diamond in a controlled fashion. When a magnetic field generated by the nanocoil of the spiral inductor modifies the spin states, a measurable change in the fluorescence emitted by the NV diamond substrate results.

Figure 3:
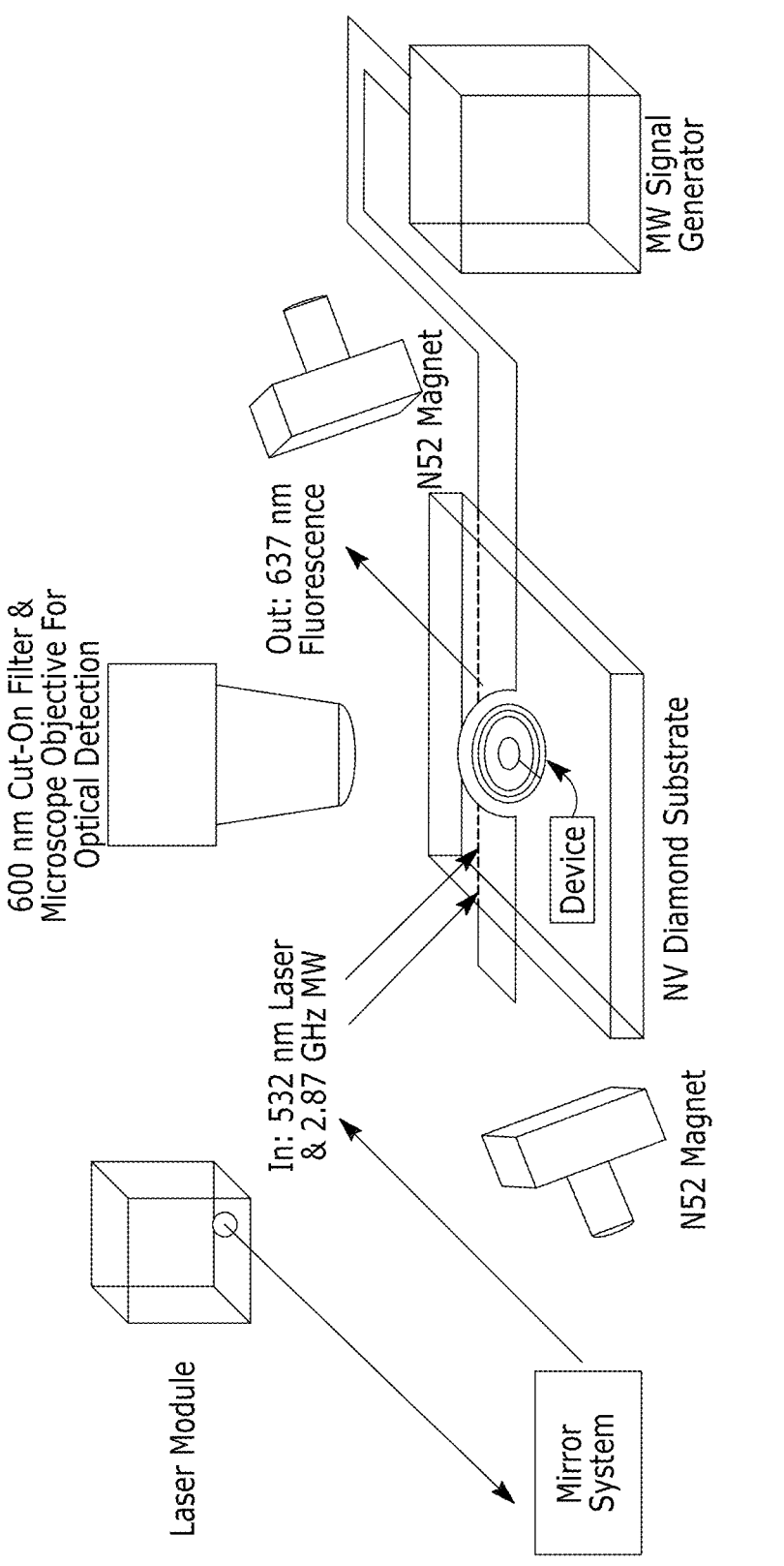
FIG. 3 is a schematic diagram of an Optically Detected Magnetic Resonance magnetometer incorporating an NV diamond-based spiral inductor.
Figures 4A, 4B:
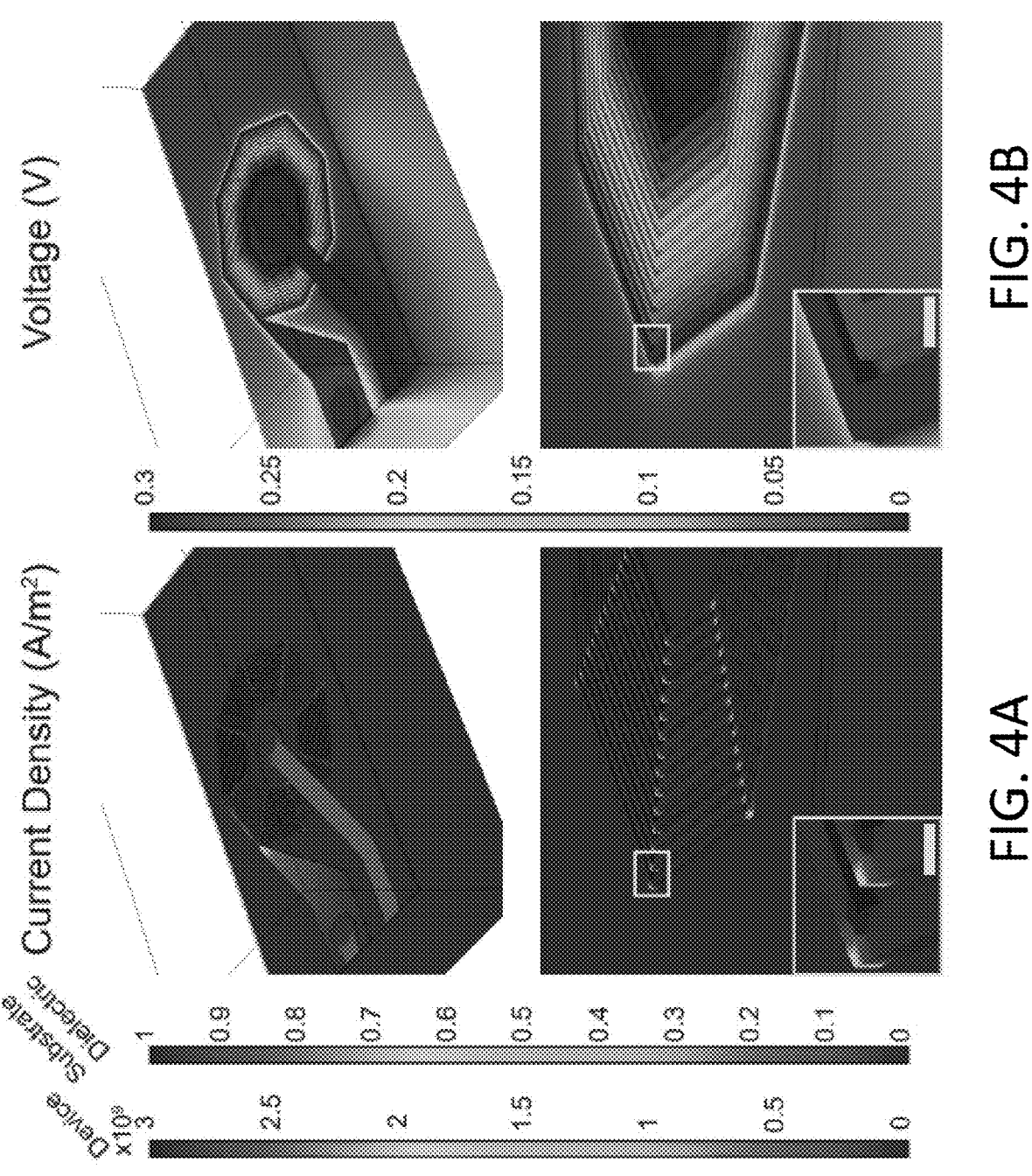
FIGS. 4A-4D show modeled electromagnetic behavior of an NV diamond-based spiral inductor in accordance with the Example.
Figures 4C, 4D:
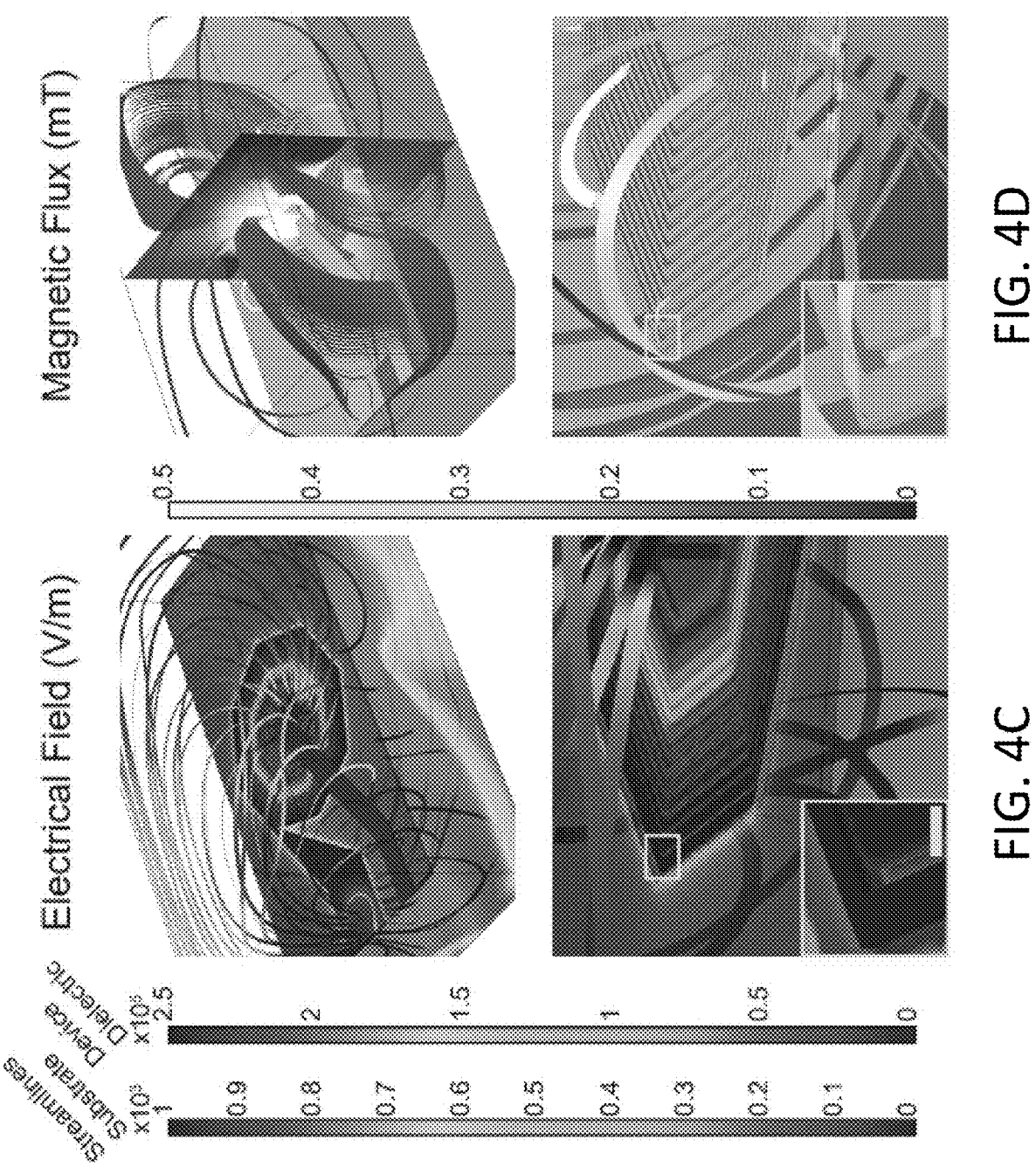

The basic components of an ODMR include: a spiral inductor of a type described herein; an optical excitation source positioned to direct excitation radiation on the NV diamond substrate and the nanocoil of the spiral inductor; a microwave source configured to apply a microwave signal to the NV diamond substrate; an optical detector positioned to detect fluorescence generated by the NV diamond; and, optionally, a static magnetic field generator positioned to apply a bias magnetic field across the NV diamond. One example of an ODMR is shown in FIG. 3. This ODMR uses a laser as an optical excitation source, a CMOS camera for fluorescence detection and imaging, and includes static magnets to apply a bias magnetic field. A more detailed description of the operation of this ODMR can be found in the Example.

The principles of operation and components of ODMRs are well described in the literature. (See, for example, Levine, Edlyn V., et al., *Nanophotonics* 8.11 (2019): 1945-1973; Grinolds, M. S. et al., Nature Phys. 9, 215-219 (2013); and Aslam, N. et al., Nat. Rev. Phys. 5, 157-169 (2023); and PCT patent application publication number WO 2016/118791.) Briefly, when the NV centers of the diamond substrate are excited with excitation radiation (e.g., 532 nm green light) incident upon the NV diamond, electrons in the NV centers become excited (pumped) into the |0> spin state to initialize the system. In the ground state of NV diamond this |0> spin state is separated from energetically degenerate |±1> spin states by 2.87 GHz. However, in the presence of an external magnetic field, this spin-state degeneracy is lifted and, therefore, the magnetic field strength can be determined by measuring the energy shift caused by the magnetic field, which can be optically read-out as a fluctuation in the fluorescence emitted from the NV diamond.

Once the NV diamond has been initialized, a microwave signal is applied to manipulate the electron spins. When the microwave signal is resonant with the energy difference between the ground |0> state and the |+1> or |−1> state, a transition between those spin states reduces the |0> state population and results in a decrease in the emitted fluorescence intensity. Therefore, by scanning the frequency of the microwave signals, these resonances can be observed as reductions in the measured fluorescence spectrum.

The ODMR may be operated in a continuous mode, in which the excitation radiation, the microwave signal, and the monitoring of the emitted fluorescence are continuous, or in a pulsed mode in which a first radiation pulse (e.g., a green laser pulse) for optical pumping is followed by a microwave pulse and then a second radiation pulse (which may be from the same laser) for reading out the spin states.

In embodiments of the ODMRs that include a static magnetic field generator (e.g., magnets positioned near the NV diamond substrate), the total incident magnetic field on the NV diamond will be the bias field from the magnetic field generator, which is known and constant, and the external magnetic field of the nanocoil, which fluctuates with changes in the current passing through the nanocoil. In these embodiments, changes in the magnetic field of the nanocoil are measured as changes in the total incident magnetic field.

The spiral inductors have applications beyond sensing magnetic fields and may be used in applications based on the manipulation of magnetic fields. By way of illustration, some other applications include multimodal magnetometry supplements, robotic electronic implants, computational spintronics and memory data writing, and electric field stimulators.

Example

This Example illustrates a high density nanofabricated spiral coil design for on-chip electromagnetic signal conversion (FIGS. 4A-4D). Modelling predictions of this design allowed for predictions of current density (FIG. 4A), surface potential (FIG. 4B), electric field (FIG. 4C), and magnetic flux density (FIG. 4D) for a given input and provide guidance for determining proper nanofabrication parameters for optimized performance. Using a simplified EBL fabrication process that relies on dose control to achieve high turn-density nanocoils, the process described herein utilizes proximity effect in a PMMA resist exposure and metal lift-off to demonstrate tightly packed nanocoils with minimal PMMA collapse, achieving 49.7 nm turn spacing and inductance of up to 12.8 nH for 10 turn prototypes. Using diamond-based optical magnetometry in conjunction with finite element computational modeling, efficient magnetic field generation at the center of the nanocoil was demonstrated.

Results

Figure 5A:
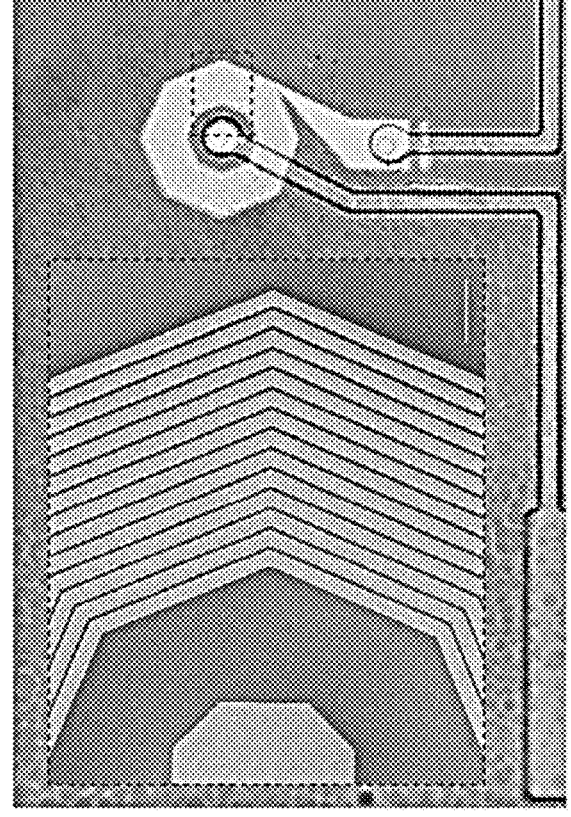
FIGS. 5A-5L show dose dependent feature analysis of nanofabricated spiral coils in accordance with the Example.
Figure 5B:
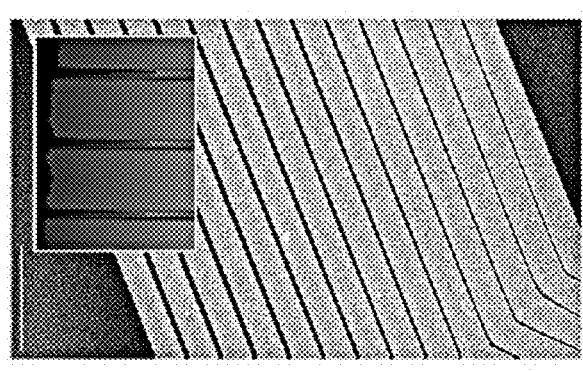
Figure 5B:
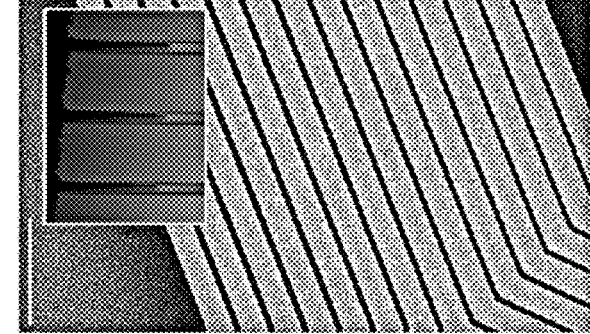
Figure 5B:
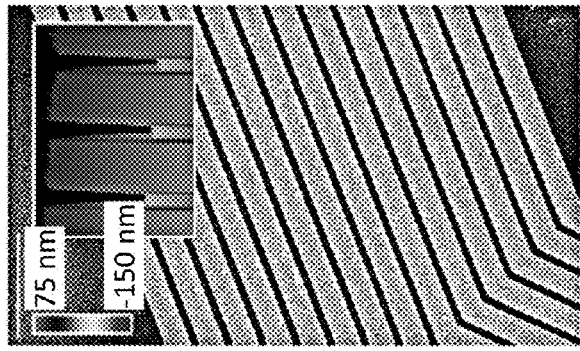
Figure 5C:
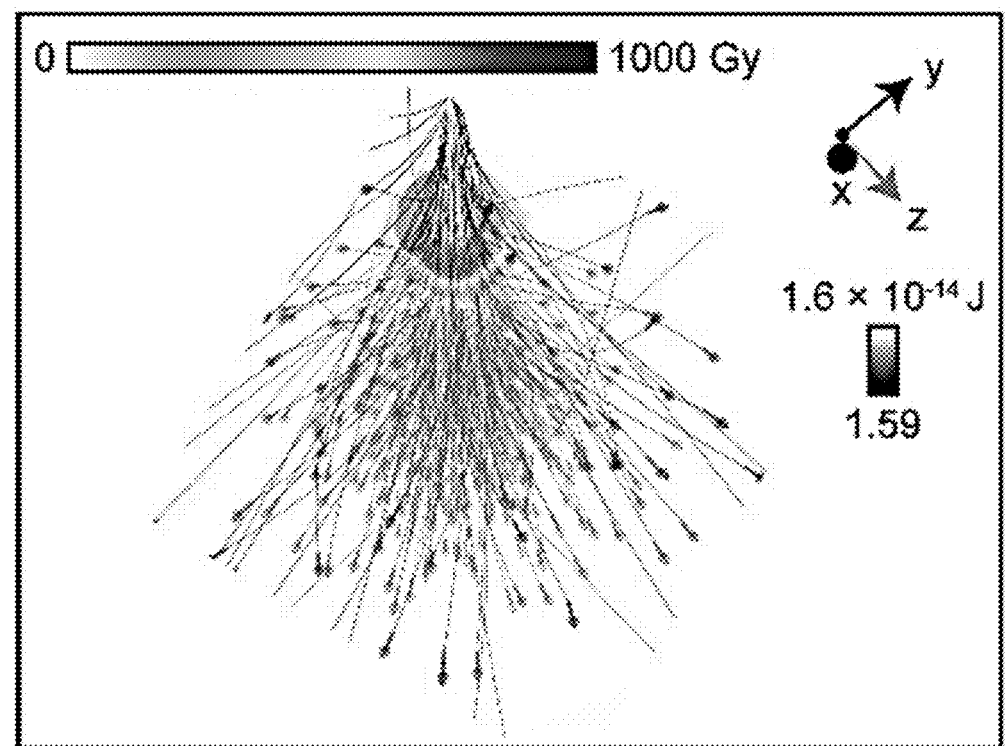
Figure 5D:
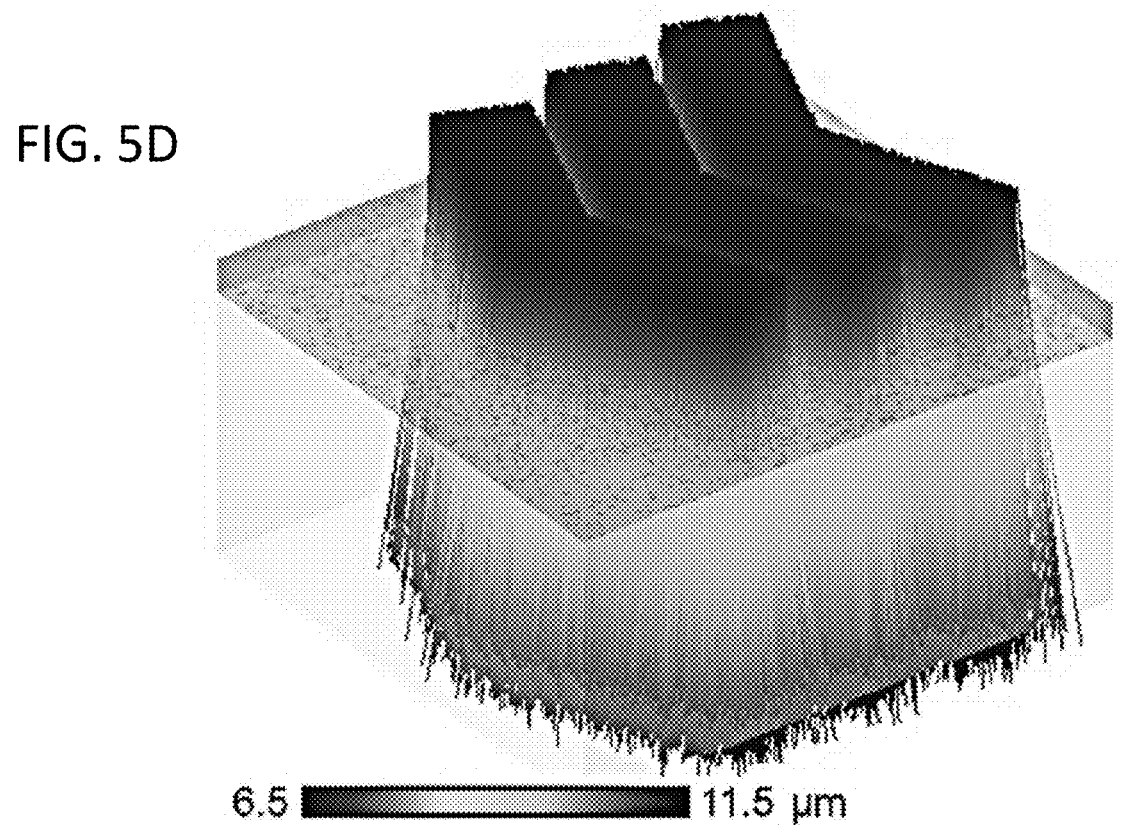
Figure 5E:
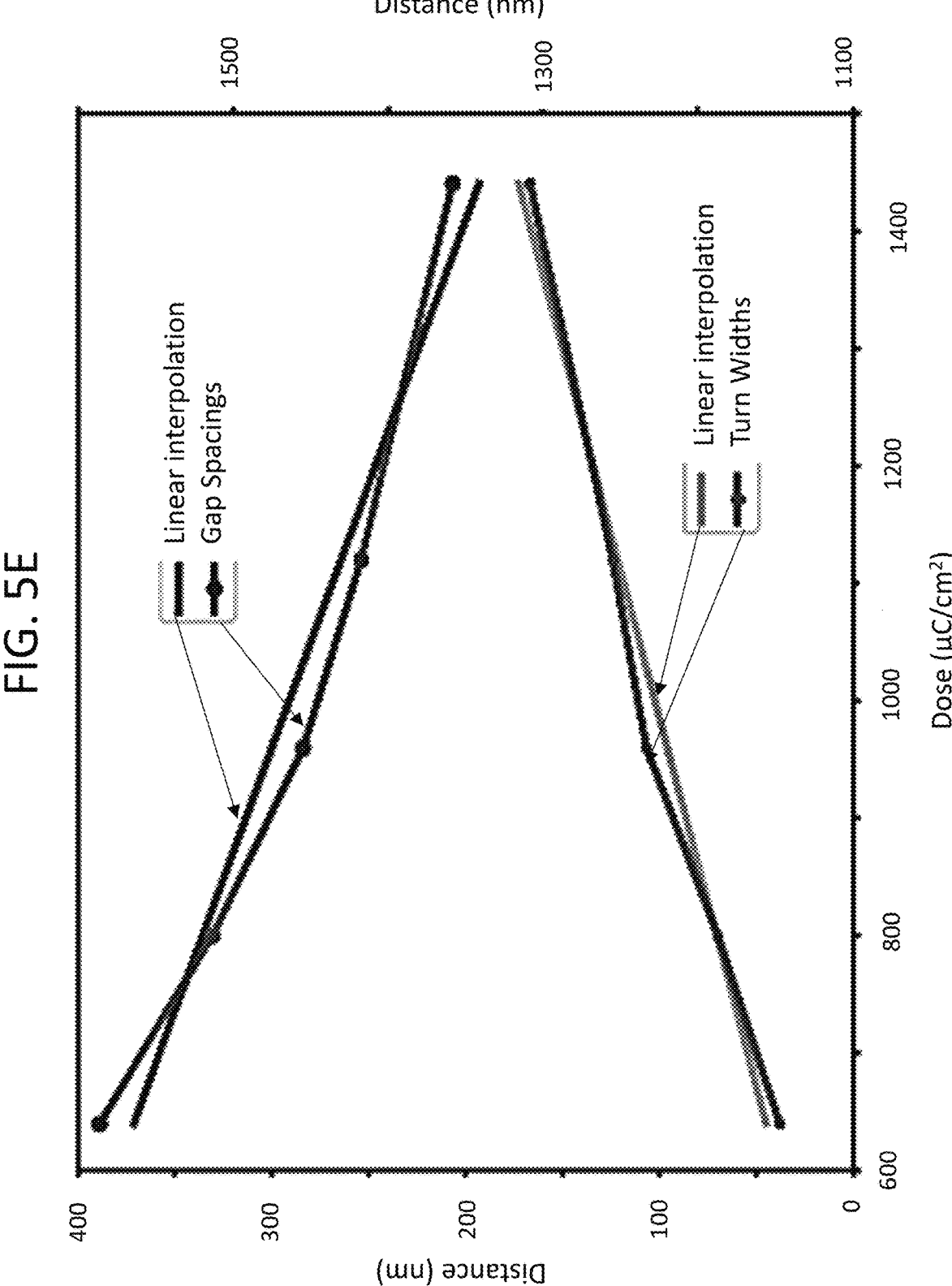
Figures 5F, 5G, 5H:
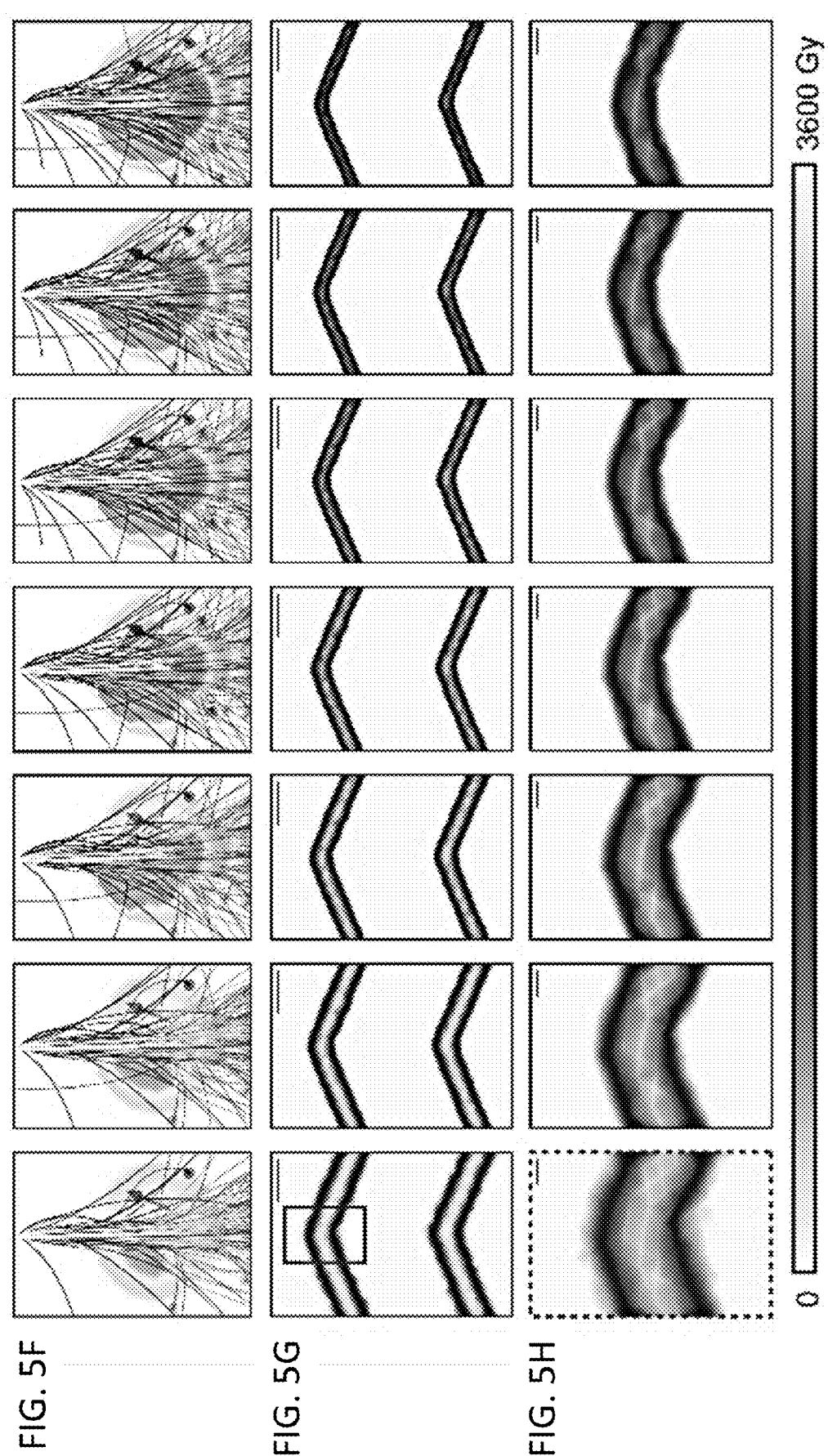
Figures 5I, 5J, 5K, 5L:
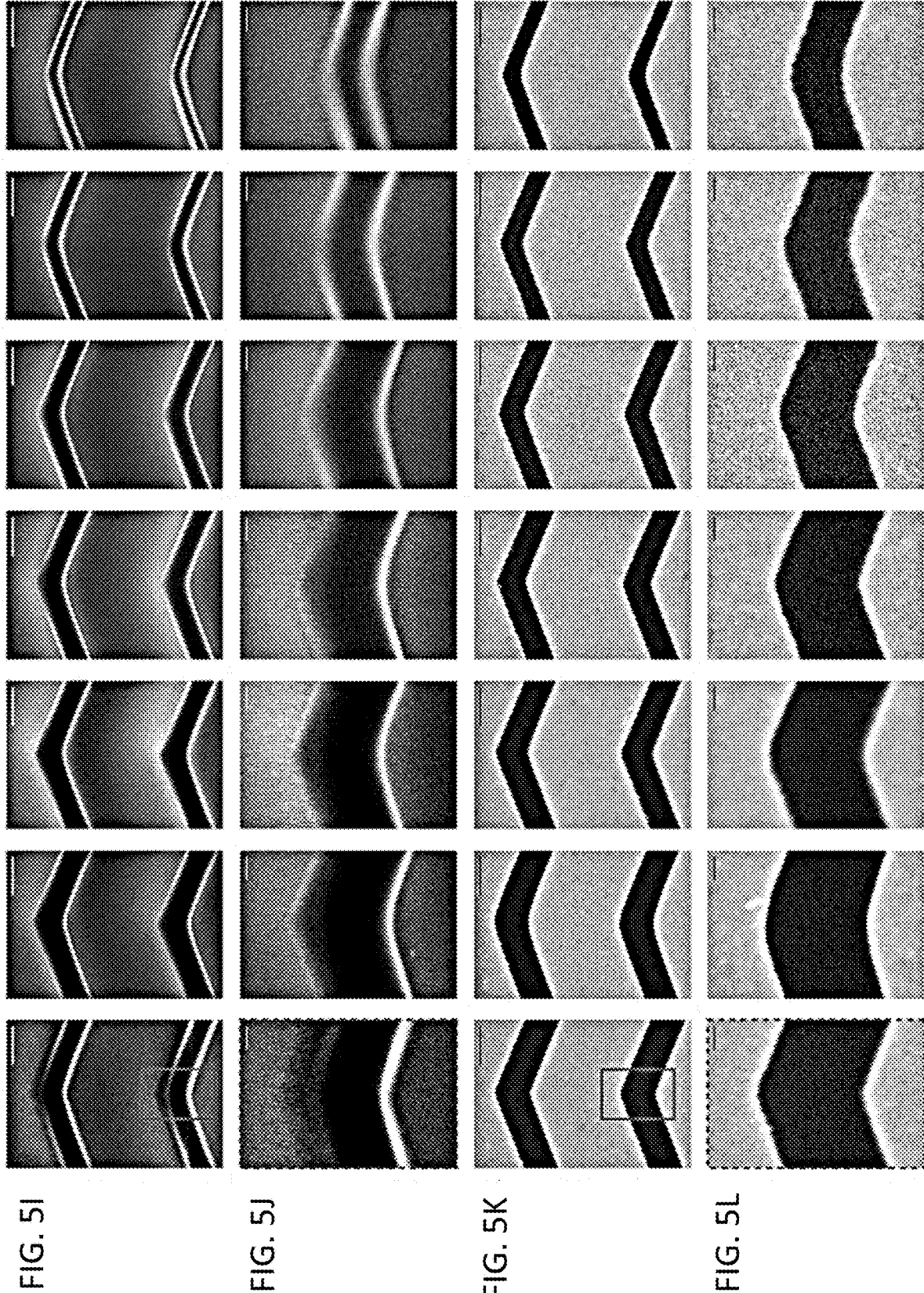

The EBL fabrication process depicted in FIGS. 2A-2H was used to make the spiral nanocoils using a broad e-beam dose matrix ranging between 640 and 1600 $\mu C/cm^2$ (FIGS. 5A-5L). The end device (FIG. 5A) exhibits minimum coil turn spacing (s) of 197.8 nm for a dose of 1120 $\mu C/cm^2$ (FIG. 5A, inset). Proximity effect of an identical pattern was utilized to control nanocoil turn width (w) and s (FIG. 5B) while maintaining constant turn density. E-beam doses of 800, 1440, and 1600 $\mu C/cm^2$ are shown in FIG. 5B, left, middle, and right subpanels, yielding a minimum of s=329.6, 300.3, and 139.2 nm, respectively, and an average Ti/Au slope of 50.98±1.14 degrees (1.23±0.05 $nm_{(z)}/nm_{(x)}$) determined by AFM (FIG. 5B, insets). To predict the relationship between dose and s, finite element modeling of electron trajectories in PMMA (FIGS. 5C-5D) was used, demonstrating good correlation (R=0.96887) between simulated dose response (FIGS. 5F-5H) and s in PMMA following development (FIGS. 5I-5J). The mean predicted area for a single exposed dot at 2 nA and 100 keV for a dose of 640 $\mu C/cm^2$ (FIG. 5F, leftmost panel) was 6.38 $nm^2$ and increased linearly to 8.71 $nm^2$ for a dose of 1600 $\mu C/cm^2$ (FIG. 5F, rightmost panel). The resulting average s following lift off ranged between 206.7 and 389.2 nm (FIGS. 5K-5L) for doses ranging between 1440 and 640 $\mu C/cm^2$. For this range, an inverse linear relationship between dose and s (FIG. 5E) was demonstrated, corresponding to a surface resistance ranging between 349.58 and 397.16 kΩ/m for the same metal film thickness across all devices.

High current amplitude range during normal device operation can result in high ohmic loss and a localized hot region with changes as small as 10 mK in ambient temperature, resulting in magnetic field change of ~30 nT and reduced accuracy. Dose selection can be used to mitigate such alterations in device characteristics by adapting impedance and turn density to the expected current range and maximizing coil fill factor. This can be achieved by increasing the dose of electron beam exposure (FIGS. 6A-6G). Whole-coil resistance (FIG. 6B), parasitic inter-turn capacitance (FIG. 6C), Wheeler and sheet spiral coil inductance estimates (FIG. 6D), and corresponding Q factor (FIG. 6E), and self-resonance (FIG. 6F) are plotted with respect to dose. Q factor and resonance frequency can be tuned by dose selection with lower doses suitable for improved Q factor but increased resistive heating. For the resonance frequencies shown here (FIG. 6G) impedance is the major contributor to higher loss whereby Q is reduced by 16.9% from 1.76 (1.78) to 1.46 (1.47) using Wheeler (Sheet) estimates for doses of 1440 $\mu C/cm^2$ and 640 $\mu C/cm^2$ and corresponding self-capacitance of 3.3 fF and 6.3 fF and resistance of 1089.8Ω and 960.1Ω, respectively. In addition to performance considerations, e-beam dose control during EBL can be used for frequency tuning (FIGS. 6E and 6G) demonstrating average frequency shifts of 0.92±0.36 GHz per 100 $\mu C/cm^2$.

Figure 6A:
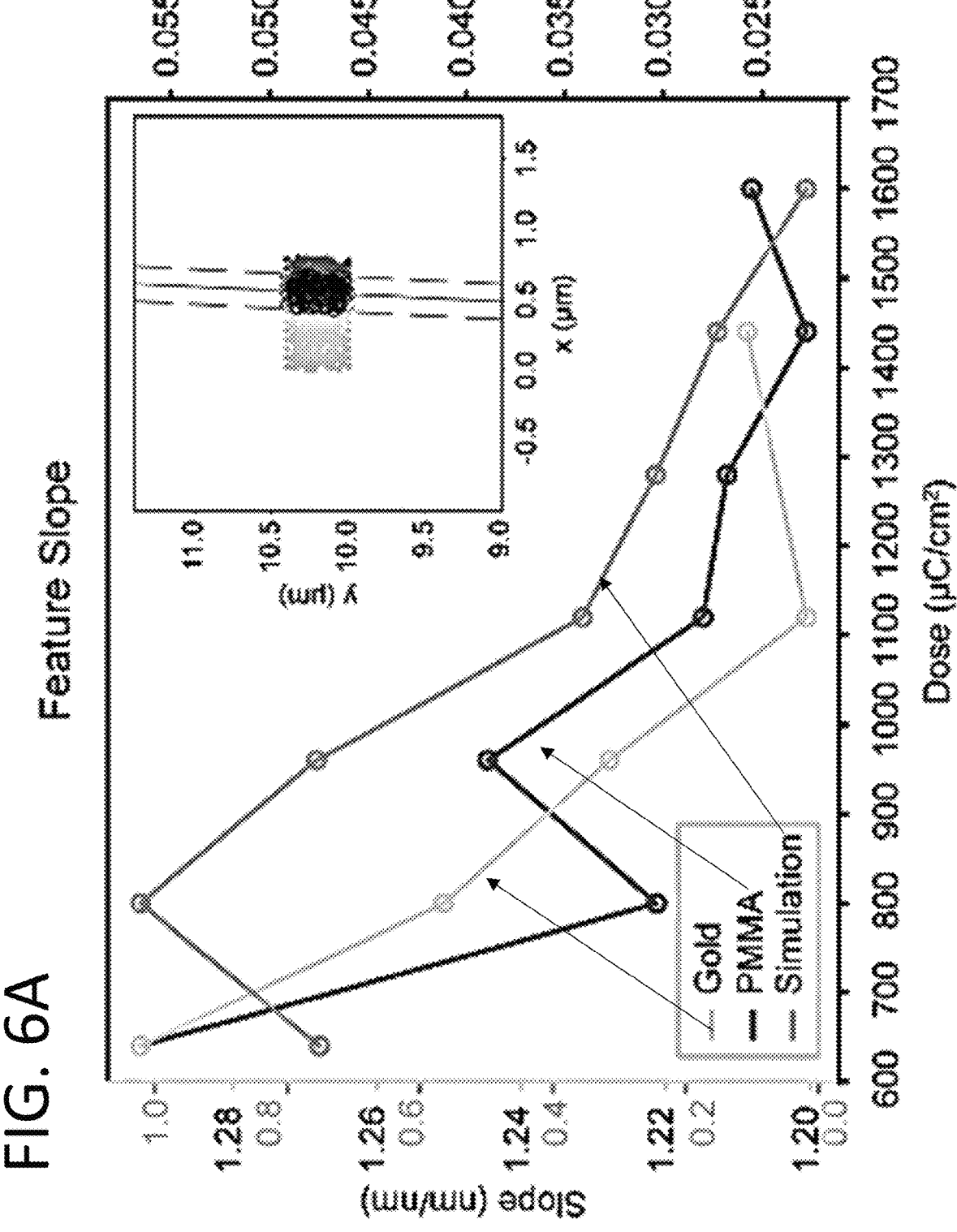
FIGS. 6A-6G show nanocoil feature measurements and fitness calculations in accordance with the Example.
Figure 6B:
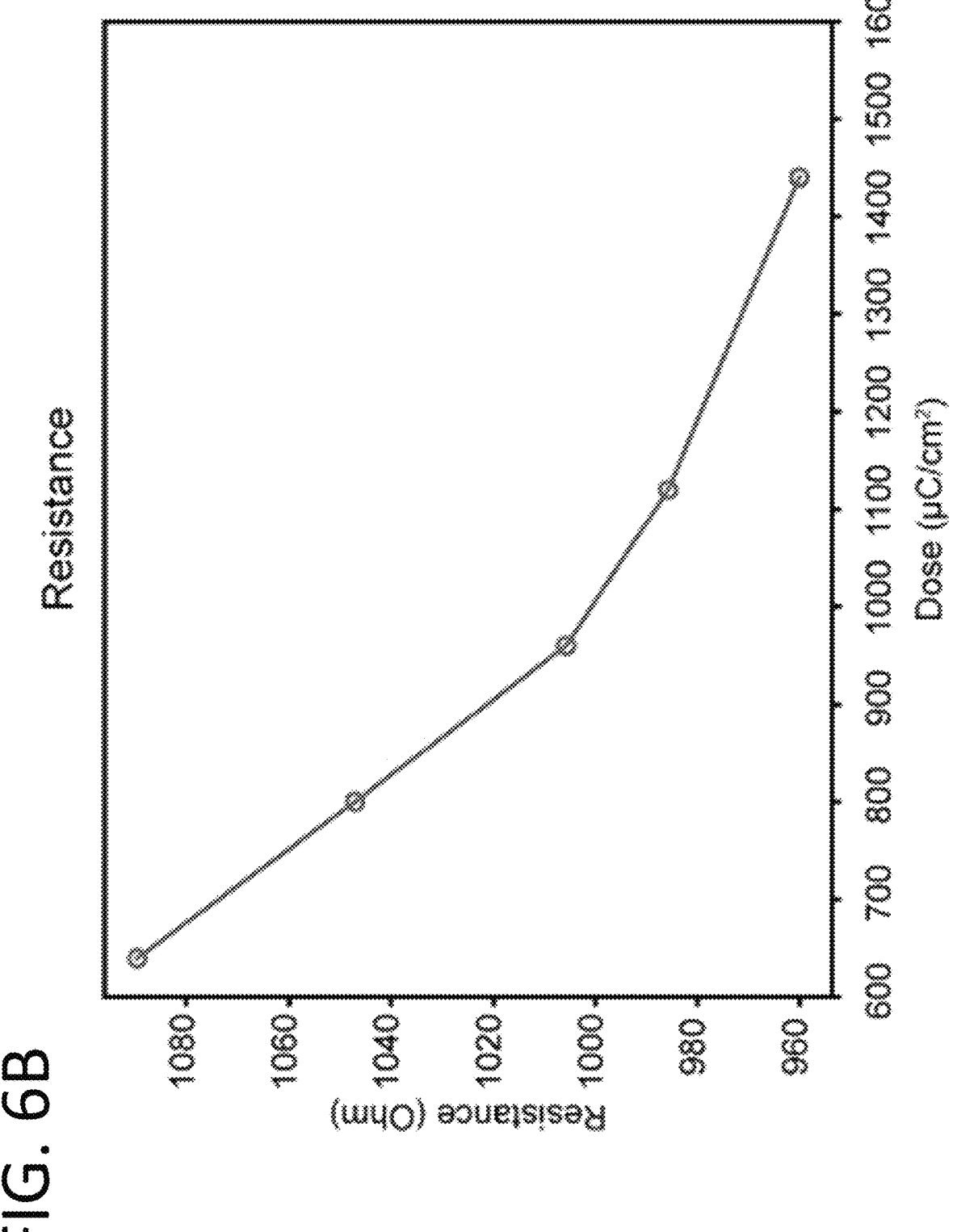
Figure 6C:
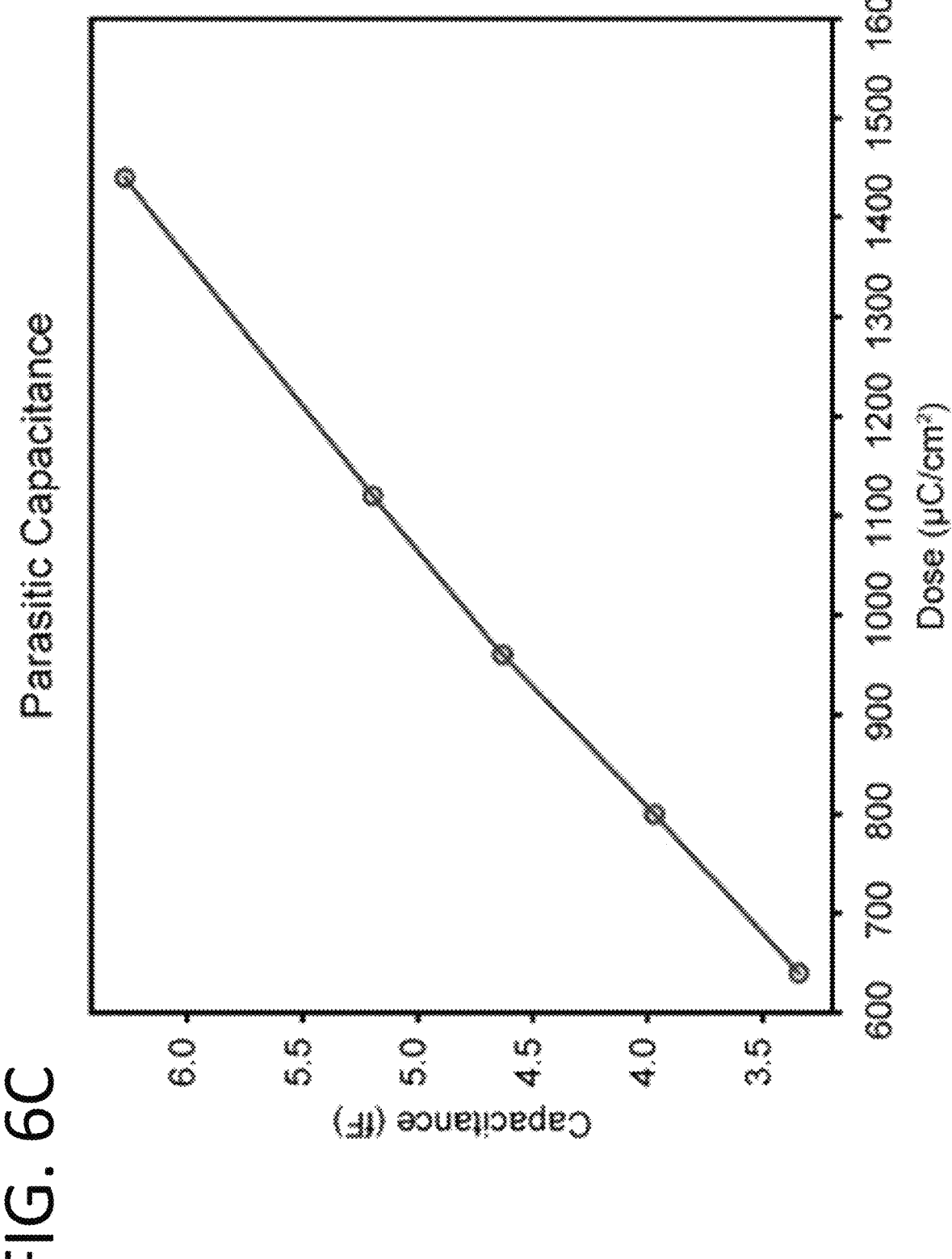
Figure 6D:
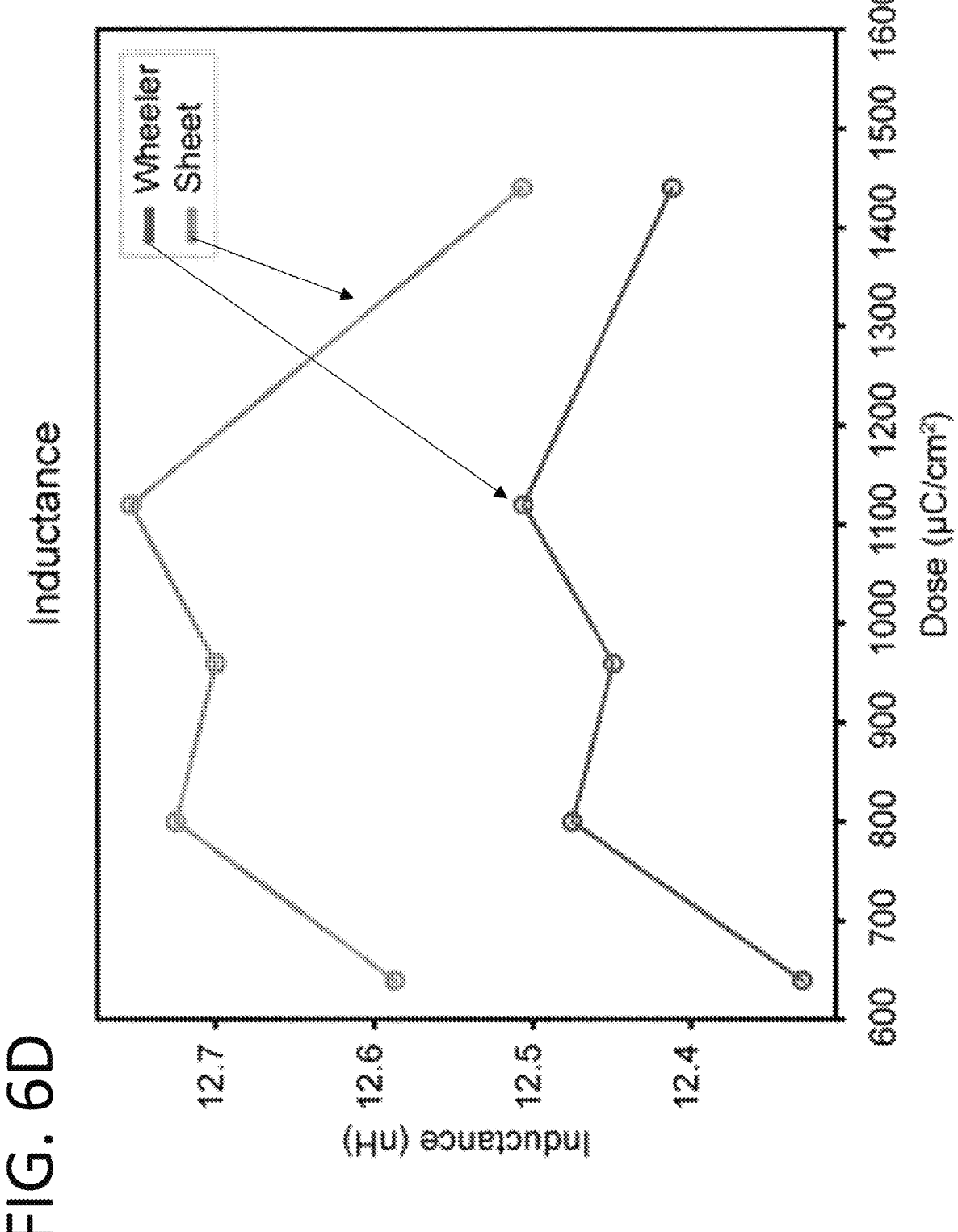
Figure 6E:
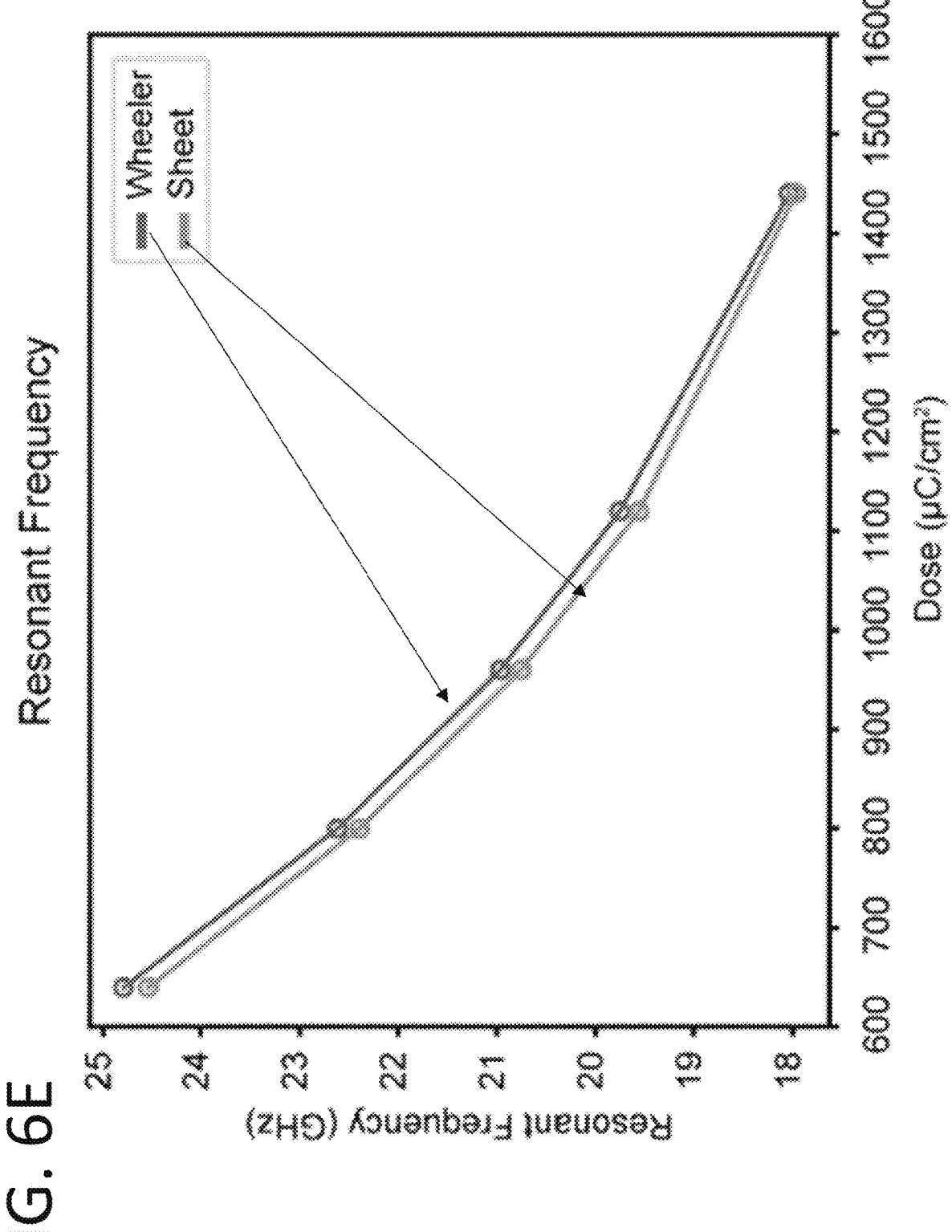
Figure 6F:
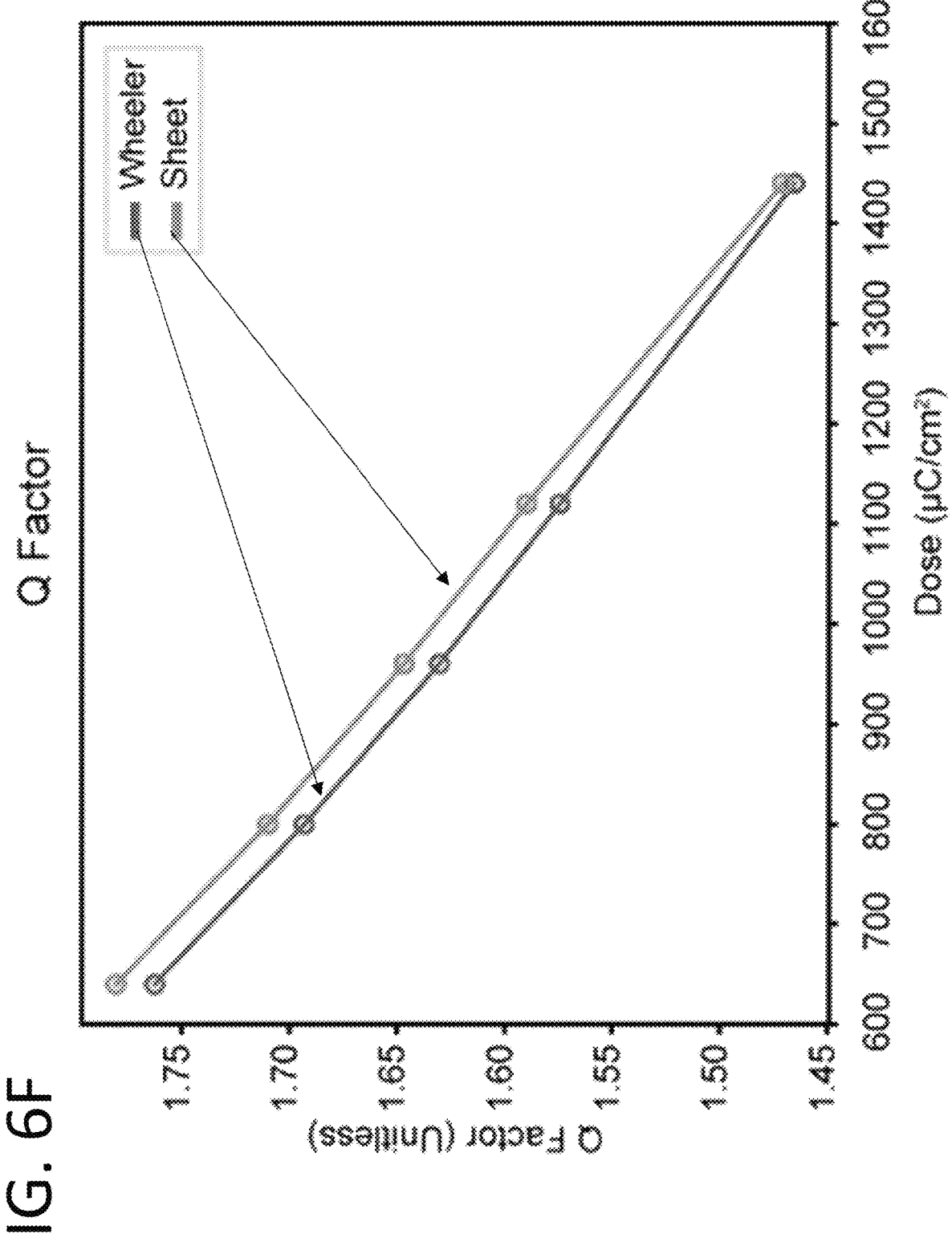
Figure 6G:
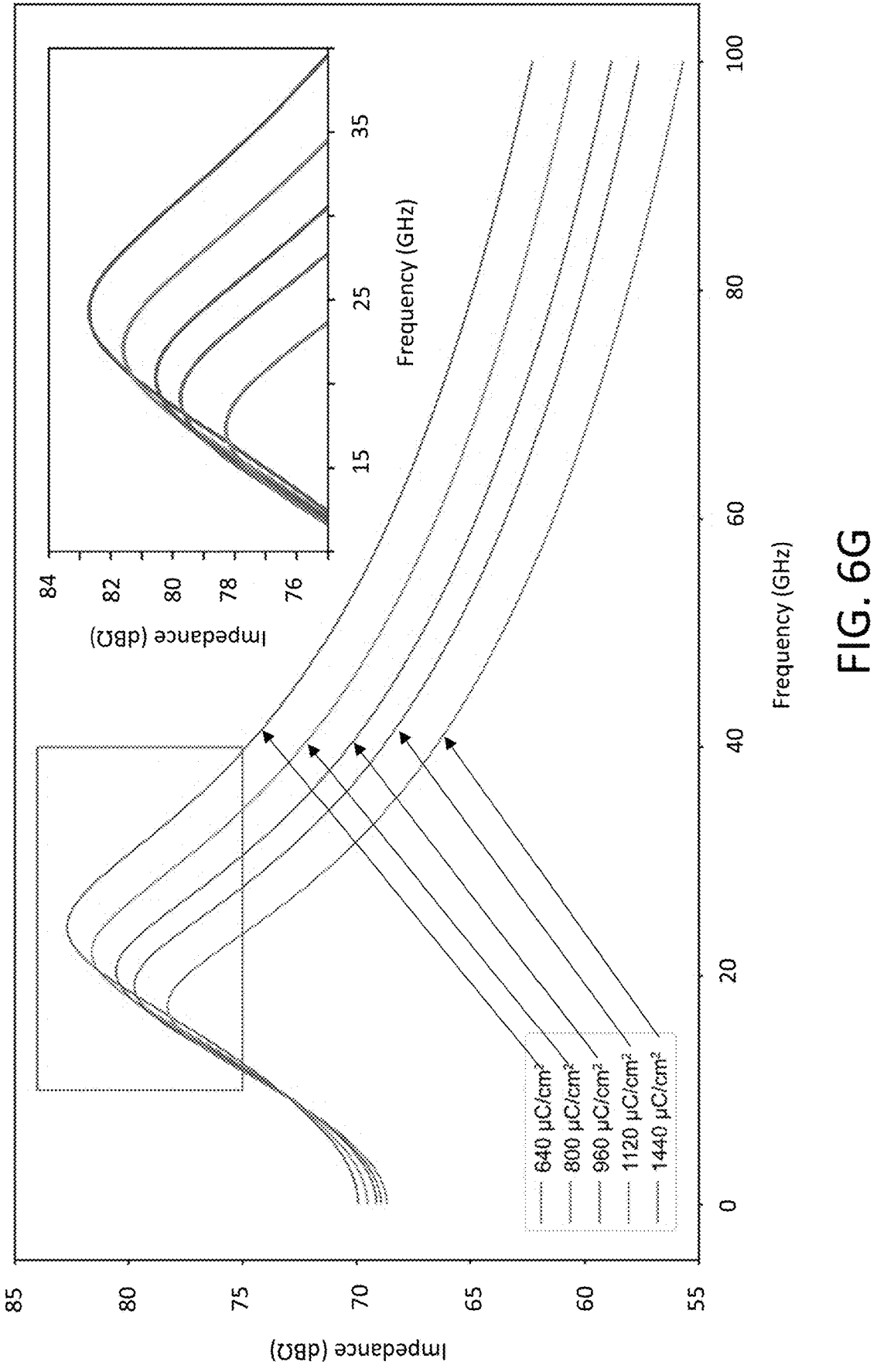

A relatively constant inductance is concomitant with evenly spaced coil turns and serves as a foundation for optimizing all other parameters. Measurements of turn slope using atomic force microscopy (FIG. 6A) and scanning electron microscopy (FIG. 6A) show asymptotic decreases in slope with increased dose, in agreement with the Monte Carlo finite element analysis model. Vertical slant has the potential to impact heat dissipation and capacitive coupling, enabling further optimization of coil behavior for applications in vivo. Comparing the impedance in decibel ohms to linear frequency revealed a dose-dependent tuning curve (FIG. 6G) with varying resonant frequency and Q factor (FIG. 6G, inset).

Figure 7A:
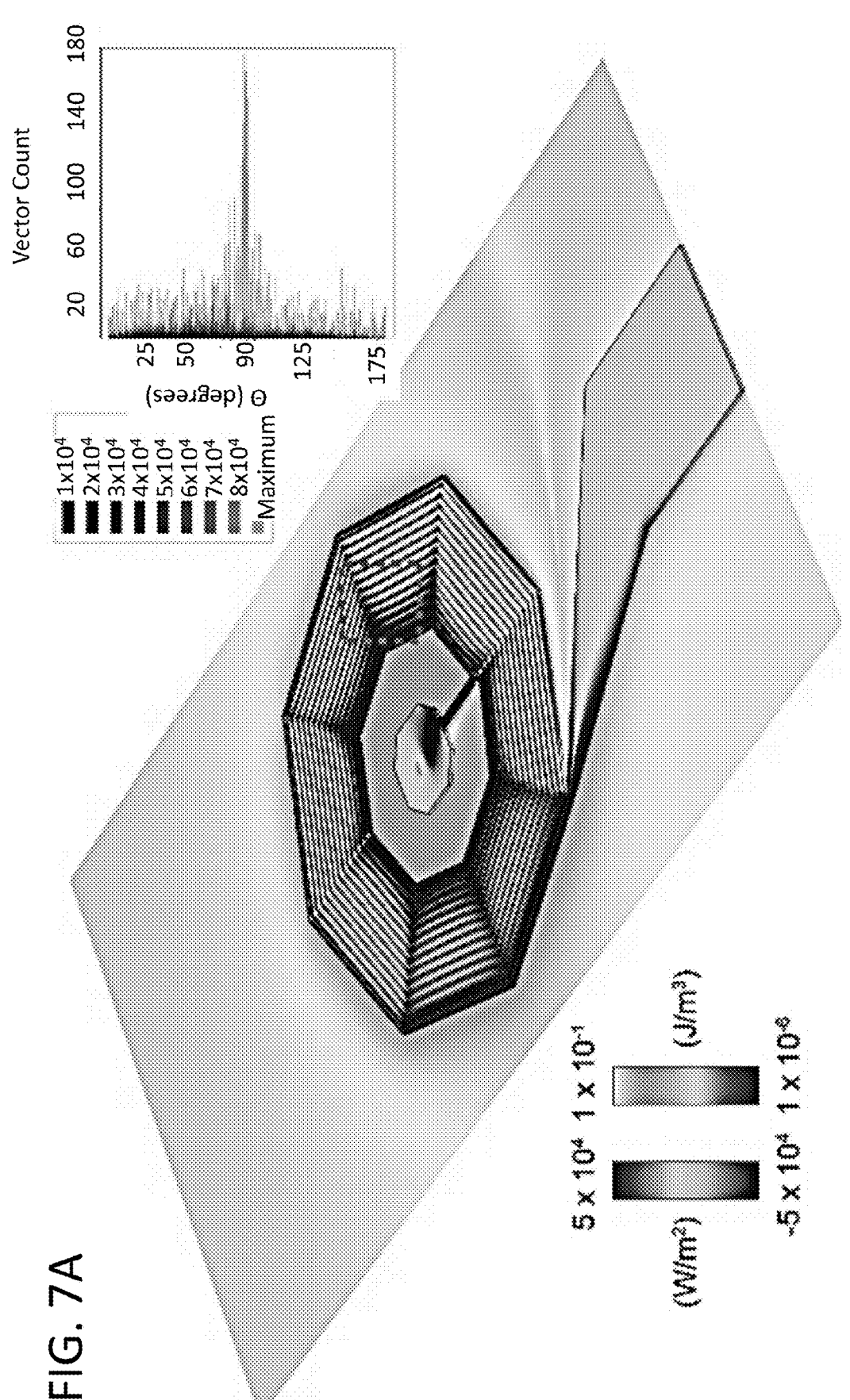
Figure 7B:
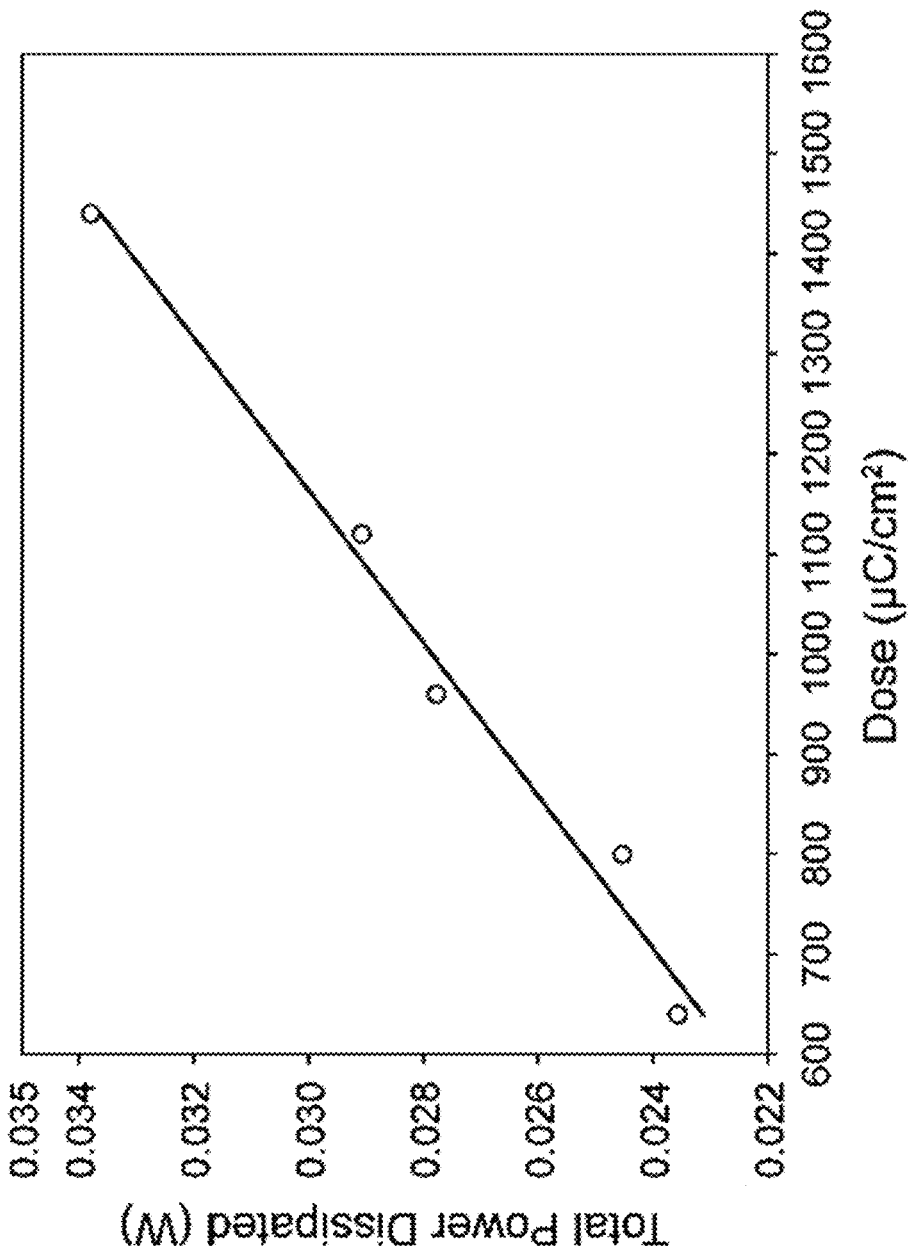
Figure 7I:
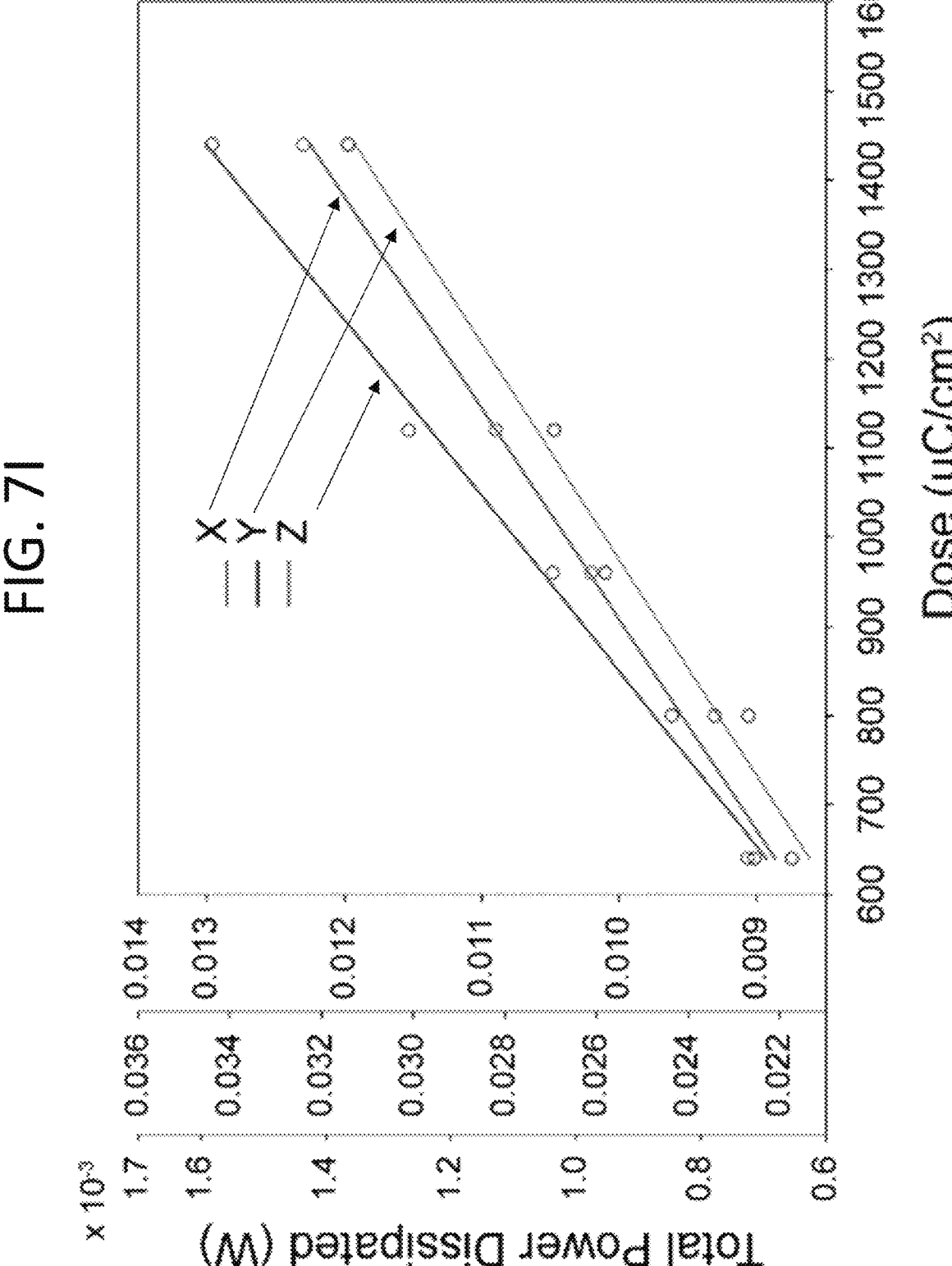

To fully explore the parameter space of nanocoil characteristics, e-beam dose-dependent power dissipation was quantified using finite element analysis (FIGS. 7A-7I). A full view of the nanocoil (FIG. 7A) corresponding to a dose of 640 $\mu C/cm^2$ with the coil surface color-coded by x-component of the Poynting vector ($Po_x$) and plane of coil color-coded by magnetic energy density ($J/m^3$) reveals significant stratification within the coil and gradients outside the coil for a 3-mA applied current. The dashed box in FIG. 7A corresponds to regions expanded in FIG. 7G and FIG. 7H. A subtraction histogram between high dose (1440 $\mu C/cm^2$) and low dose (640 $\mu C/cm^2$) vector count versus angle arranged by magnitude revealed stark differences in directionality surrounding 90 degrees corresponding to the plane of the coil (FIG. 7A, inset). Integrating the vector magnitudes of X, Y, and Z components $\| \oiint_{coil} Po_x \hat{x} + \oiint_{coil} Po_y \hat{y} + \oiint_{coil} Po_z \hat{z} \|$ of dissipated power versus dose over the entire nanocoil surface demonstrated a linear trend between e-beam dose-dependent turn width and dissipated power (FIG. 7B). Two-dimensional (2D) Poynting vector x ($Po_x$), y ($Po_y$) and z ($Po_z$) plots for 640 $\mu C/cm^2$ (FIGS. 7C, 7E, and 7G) and 1440 $\mu C/cm^2$ (FIGS. 7D, 7F, and 7H) show significant changes in power distribution with dose. Separate surface integrals of the X, Y, and Z components of the Poynting vector also affirmed linear relationships between e-beam dose-dependent turn width and dissipated power (FIG. 7I). These results provide a basis for optimizing power characteristics for nanofabricated coils on NV diamond.

Figure 8A:
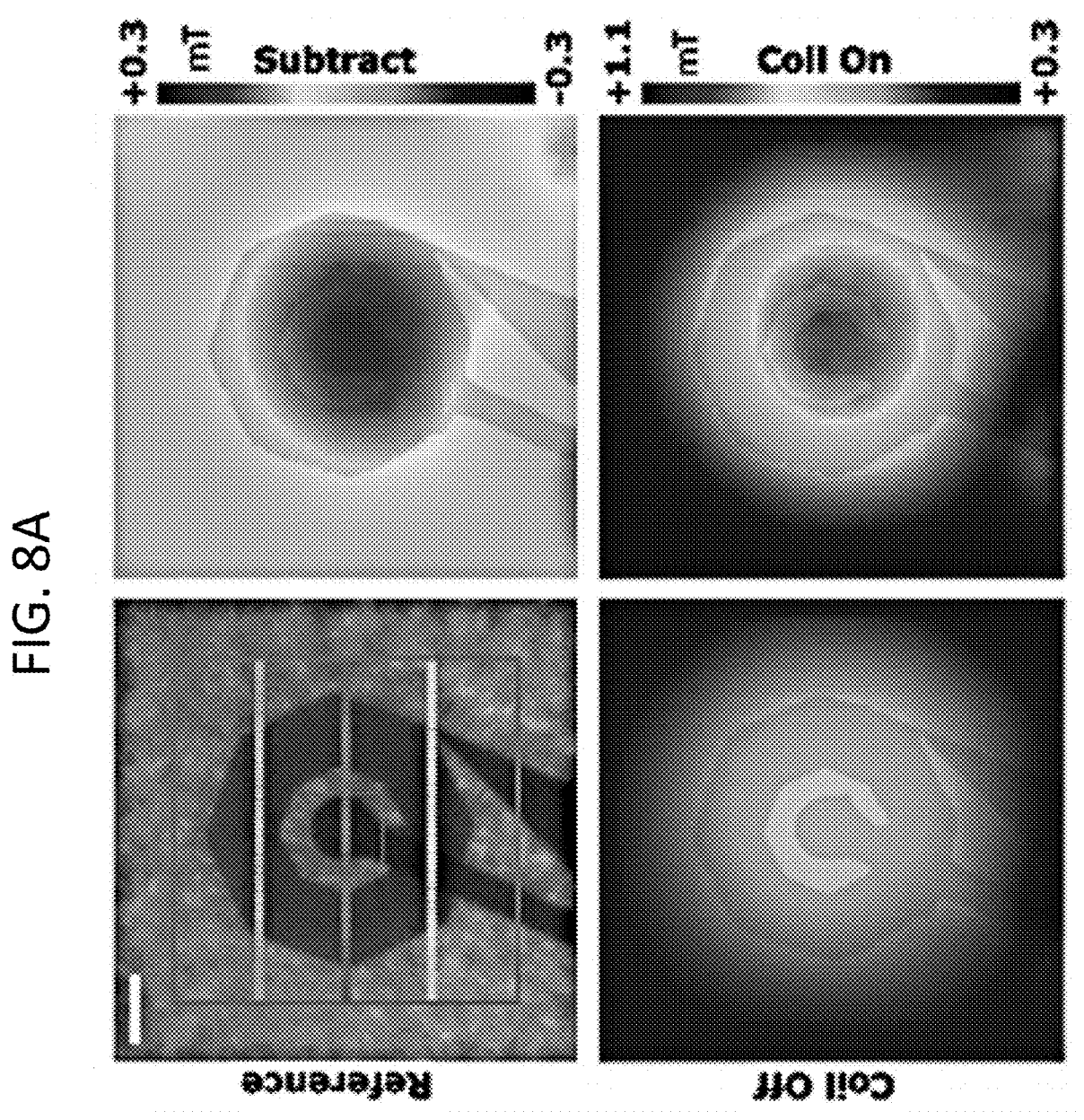
Figure 8B:
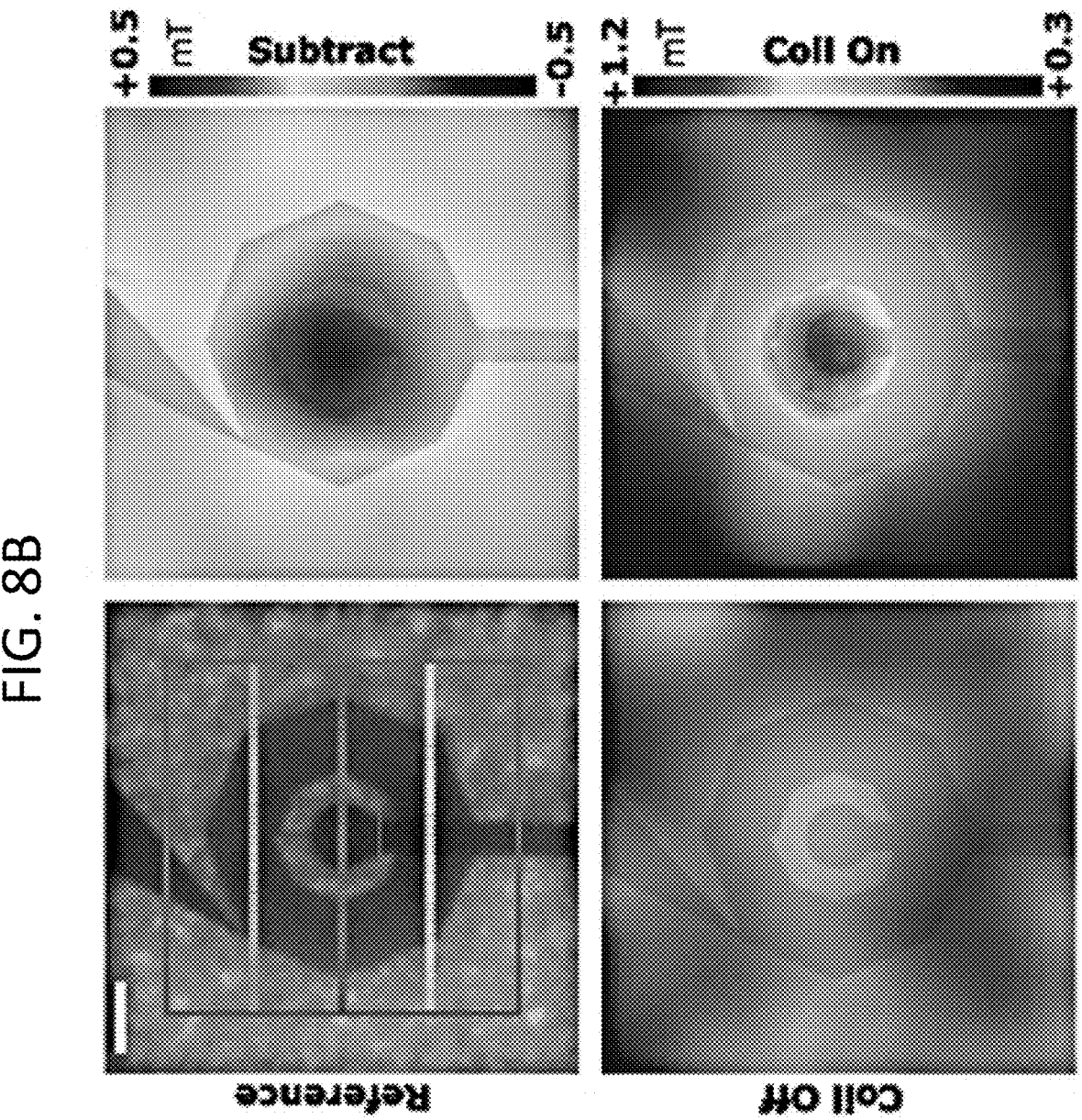

To quantify the magnetic (B)-field strength developing in the spiral inductor in response to current injected into the nanocoil and to verify conformity with the modeling predictions, optically detected magnetic resonance (ODMR) micromagnetometry was used, forming an electromagnetic to optical junction on-chip (FIG. 3 and FIGS. 8A-8K). Nanocoils on nitrogen vacancy (NV) diamond samples were excited at 532 nm and RF-irradiated at frequencies ranging between 2.78 and 2.96 GHz in the presence of a DC magnetic field (0.8 mT) (FIG. 3). Two different routing configurations were compared to account for electrode path contributions to the magnetic field (FIGS. 8A-8B, upper left panels). RF spectra were acquired in conjunction with optical collection at 637 nm with and without current injection (bottom left and bottom right panels in FIGS. 8A and 8B, respectively). The mean amplitude of the magnetic B-field strength across the nanocoil was 0.18±0.08 mT (FIG. 8A) and 0.28±0.003 mT, FIG. 8B) for the two configurations, demonstrating no significant difference (p=7.06·10⁻⁵ across 80 μm diameter field of view surrounding nanocoil center). Respective B-field maps predicted by finite element simulations show mean B-field amplitude of 0.08±0.03 mT, corresponding relatively well with measurements (R=1.2·10⁻²). To confirm sufficient magnetic field uniformity across the coil surface, magnetic field gradients (FIGS. 8C-8F) were quantified to generate corresponding uniformity maps from ODMR measurements (FIGS. 8G-8H) and the measurements were compared to finite element simulation results (FIG. 8I). It was found that uniformity within the sensing region of the coil region was within ±1.2% with regions outside the coil experiencing slightly higher field inhomogeneity (<±3%) correlating well with the simulation results. Finally, a maximal B-field of 0.25±0.03 mT (FIG. 8I) and 0.38±0.08 mT (FIG. 8K) were measured at the center of the nanocoils for both configurations, occupying an area of 1.26·10³ μm² and corresponding to a predicted maximal B-field of 0.47±0.13 mT interpolated over 1 μm pixel size in the model.

Discussion

These results demonstrate an electromagnetic-to-optical junction mediated by nanofabricated spiral coils that enable diamond-based optical magnetometry, as well as optical NMR detection schemes. Using a protocol for careful control of self-resonance in conjunction with integration of additional capacitive elements, standalone devices can be specifically tuned to 2.87 GHz frequencies for efficient (on resonance) in situ RF irradiation of NV diamond and nanocoils. Further, the utilization of dedicated pulse sequences with modified photonic and RF temporal signatures can increase contrast and sensitivity. Combined with tuned resonance, this type of configuration is can be used to increase RF energy harvesting and greatly improve ODMR sensitivity, broadly impacting quantum information storage and computing by incorporating substrate-integrated patterned nanocoil arrays to augment spin-based computational elements.

Materials and Methods

Nanofabrication Process Development

The fabrication process included three main steps: (1) high fill-factor nanocoil EBL on resistive substrates, including NV diamond; (2) photolithography (PL) for micropatterning of nanocoil contacts and die routing; and (3) wire bonding and encapsulation onto glass printed circuit board for micromagnetometry measurements. Standard lift-off (FIGS. 2A-2H) was used on either glass (76.22 mm Borofloat 33, 500 μm thick wafers) or diamond (3.6×3.6 mm electronic-grade 400 μm thick samples, 10 μm~3.8 ppm nitrogen vacancy (NV) layer, Element six, Santa Clara, CA). Samples were cleaned using isopropyl alcohol (IPA) and dried with N₂ (100%) for EBL preparation (FIG. 2A) followed by deposition of a 100 nm SiO₂ barrier layer (FIG. 2B) by PECVD (PlasmaTherm 73/72, Saint Petersburg, FL) with chamber temperature of 2500 C, 810 squared cubic centimeters per minute (SCCM) N₂O, 440 SSCM 2% silane, 900 mT pressure, and 36 W radio frequency (RF) power, at 100 s deposition time. During process development on diamond samples, the barrier layer was etched and redeposited several times using buffered oxide etch (BOE 6:1) for 10 minutes and rinsed with deionized (DI) water, with no observed injury to the NV diamond layer or bulk substrate. Following deposition, samples were spin coated (FIG. 2C) with PMMA 950K A7 (M230002, Kayaku Advanced Materials Inc., Westborough MA) at 3600 rotations per minute (RPM) for 60 sec and then baked at 180° C. for 2 min to yield typical resist thickness of 400 nm. EBL (Elionix ELS G-100, 100 keV, 2 nA, 2.5 nm pixel size, 0.01-0.05 μs dwell time for doses 320-1440 μs/cm², 500 μm field size) was used to test a high e-beam exposure matrix ranging between 320 and 1600 μC/cm² for over-exposing nanocoil features to widen turn width and narrow turn spacing (s) in the resist during development. Samples were developed with IPA: MIBK (2:1) (2 min). A dose of 800 μC/cm² yielded 330 nm spacing reproducibly. Based on EBL optimization and following PMMA development, samples were rinsed with IPA and DI water, and dried with N₂ prior to metal deposition and lift off (FIGS. 2D and 2E, respectively). After a 10 sec oxygen plasma treatment to descum surface (YES R3 Plasma Asher, 250 W, 80 SCCM O₂) a Ti/Au (6/60 nm) metal bilayer was deposited via e-beam evaporation without breaking vacuum (FIG. 2D). The nanocoil was then realized by lift-off in an ultrasonic bath at medium-high vibration rate with remover (Microposit Remover 1165, Kayaku Advanced materials Inc., Westborough MA) for 10 minutes (FIG. 2E) followed by DI water rinse and N₂ drying. An additional 400 nm SiO₂ insulating layer (FIG. 2F) was deposited via PECVD (250° C., 810 SCCM N₂O, 440 SSCM 2% silane, 900 mT pressure, 36 W RF, 100 s deposition time) as a pre-step to micropatterning of contacts by PL.

Contacts Micropatterning and Outside Routing

Optical microlithography was used for fabricating electrode contacts to connect the nanocoil to outside circuitry. The insulating overlayer of the spiral conductor was spin coated with S183 photoresist (30 s, 3000 RPM, 1.3 μm thickness) baked at 110° C. for 1 min, followed by soft contact lithography (Karl Suss MA6, 9.5 s exposure time, 10 mW/cm² broadband mercury lamp) to pattern via holes at the nanocoil interface pads (electron contacts) (FIG. 2G). Samples were developed in MF-321 (Kayaku Advanced Materials Inc., Westborough MA) for 60 sec, washed with DI water and dried with N₂. Holes were etched in RIE chamber with a CF₄-based recipe (PlasmaTherm 790, chamber temperature 40° C., 45 SCCM CF₄, 5 SCCM O₂, 40 mT pressure, 100 W RF power, etch time of 360 m) washed with DI water and dried with N₂ to expose nanocoil metal contact pads (FIG. 2G, inset). This was followed by an additional lithography step and lift-off process to generate electrode traces for on-chip routing (FIG. 2H) using APOL-LO 3204 negative photoresist (KemLab Inc., Woburn, Massachusetts, USA) spin coated at 4000 RPM for 30 s and soft baked at 110° C. for 1 min. Contact PL was performed with 15 s exposure time (Karl Suss MA6, 10 mW/cm²) followed by post exposure bake at 110° C. for 1 min. Finally, the sample was developed with MF321 for 2 min, rinsed with DI water and dried with $N_2$. To verify via walls were covered with gold and to create a reliable contact with nanocoil electrode contact pads, 400 nm gold was evaporated using e-beam, and lift-off was done with the recipe used for PMMA/Ti/Au lift-off described above for nanocoil fabrication. Printed glass circuit boards for die wire bonding were fabricated on a 3×2-inch glass substrate (Fisherbrand™ Extra-Thick Microscope Slides, 1.2 mm thick) using APOL-LO 3204 photoresist with the identical recipe used for contact micropatterning described above: A Ti/Au (10/200 nm) layer was deposited using e-beam evaporation followed by lift-off procedure. To bond the die to the glass printed circuit board (PCB), SU-8 2002 (Kayaku Advanced Materials Inc., West-borough MA) was used by depositing a small (1 µl) droplet on the glass surface at the chip bonding area, followed by hot plate curing at 95° C. for 5 min to homogenize SU-8 temperature. The die was then placed on the PCB on the hotplate on top of the non-crosslinked SU-8 for 5 min to let viscous SU-8 gradually reflow under the die. Subsequently, to create a permanent bond, the sample was treated with UV flood exposure and post exposure bake at 95° C. for 5 min. Next, manual gold wire bonder (KS-4524, K&S, Fort Washington, PA) was used to connect electrodes to the PCB gold traces. Finally, gold traces on the PCB were connected to co-axial SubMiniature version A (SMA) adapters (#132134-10, Amphenol Connex, Wallingford, CT) with a conductive silver ink cured at room temperature for 15 minutes.

Optical Micromagnetometry

Optically detected magnetic resonance (ODMR) micro-magnetometry was used to visualize magnetic field in the spiral inductors utilizing a 50 mW 532 nm laser (OBIS 532-80 LS 1264453, Coherent, Santa Clara, CA) to pump the NV diamond substrate. A printed microwave antenna (1 mm diameter) was used to deliver RF to the NV diamond layer underneath the microcoils in conjunction with laser excitation. Microwave signals were generated using RF signal generator (SG 384, Stanford Research Systems, Sunnyvale, CA) fed through an RF amplifier (Mini-circuits ZHL-16 W-43-S+, Scientific Components Corp, Brooklyn, NY) connected to the antenna. A direct current (DC) bias magnetic field was applied using a 1.48 T magnet (B333-N52, KJ Magnets, Pipersville, PA) placed approximately 4 inches away from the sample. The bias field at the sample was estimated to be 0.8 mT. Fluorescence signal changes during current injection at the device were captured using an upright microscope (SM-LUX HL, Leica Biosystems, Wetzlar, Germany) mounted with a CMOS camera (CS165MU1, Thorlabs Inc. Newton, NJ) operating at 12 frames/sec and a resolution of 720×540 pixels with corresponding region of interest (ROI) size of 527 by 395 µm. A total of 181 frames surrounding resonance at ~2.87 GHz were acquired while sweeping between 2.78 and 2.96 GHz at 1 MHz intervals for a total of 181 data points per pixel and acquisition time of 15 minutes. Image capture and delivery of microwave and laser were directly controlled through MATLAB (MathWorks, Inc. Natick, MA, USA) interface and in-house routines. Magnetic field strength was converted from microwave stimulation frequency through:

$$\Delta E = g_L \mu_B m_j B \quad [1]$$

$$B = \frac{2\pi h v}{g \mu_B} \quad [2]$$

where $\Delta E$ is the magnetic interaction energy due to the Zeeman effect, $\mu_B$ is the Bohr magneton, $m_j$ is total angular momentum, and B is the magnetic field. Native noise level was quantified over all sweeps per measurement.

Atomic Force Microscopy

A Bruker Dimension Icon Atomic Force Microscopy (AFM) System operating in tapping mode with TESPA-V2 tips was used to scan the nanocoils. A 50 µm wide field of view (FOV) was surveyed at a scan rate of 0.1 Hz to reduce tip and sample wear and improve image quality. Scans were imported into Bruker Nanoscope Analysis 2.0, sectioned, and exported as XZ plane height maps for further processing using Python. Turn width and spacing were determined using a partition threshold of 40 nm above the previous gap minimum. Mean turn width and spacing for all 14 turns and 13 gaps were plotted for comparison.

Finite Element Analysis

Simulations of e-beam dose trajectories and device magnetic response were performed in COMSOL multiphysics simulation environment (COMSOL Inc., Stockholm, Sweden). Optimized coil pattern described previously and used here for nanofabrication was imported to COMSOL and extruded 500 nm along the z-axis. (Phillips, J. et al. *J Neural Eng* 19, (2022).) The dielectric layer was 900 nm thick above the substrate, providing 400 nm of separation between the device and the electrode contacts. Cylinders with a diameter of 8 µm were extruded through the dielectric over the interface pad and ground pad, and microfabricated electrode contacts were patterned above the dielectric and extruded to a thickness of 400 nm. The device had 14 turns, resulting in an open core percentage of 46.2%. The electrical properties of the device and microfabricated electrode contacts were set to those of gold, $\varepsilon=1$, $\mu=1$, $\sigma=45.6 \cdot 10^6$ S/m. The electrical properties of the substrate and dielectric layer in the model were set to those of silicon dioxide ($SiO_2$), $\varepsilon=4.2$, $\mu=1$, $\sigma=1e-15$ S/m. The electrical properties of the space above the device were set to those of air, $\varepsilon=1$, $\mu=1$, $\sigma=0.7$ S/m. All device geometries were tested using an input current of 3 mA. The current was input through the outside face of the microfabricated electrode contact connecting to the interface pad at the center of the inductor. The outside face of the electrode contact above the ground pad was used as the ground port.

Monte Carlo modeling of electron trajectory and sample exposure was performed using the charged particle tracing (cpt) module. A pattern consisting of three 1.02 m wide nanocoil turns was constructed within a simulation arena defined as a 7×7×7 $m^3$ region of vacuum. A base layer of quartz glass 3 µm thick with $\varepsilon=4.2$, $\sigma=1e-14$ S/m, and $\rho=2210$ kg/$m^3$ was used as the substrate. A layer of 400 nm thick Microchem 950 PMMA resist was placed atop the substrate with $\sigma=1 \cdot 10^{-19}$ S/m and $\rho=1180$ kg/$m^3$. A titanium surface with $\varepsilon=1 \cdot 10^{100}$ (virtually ∞) and $\sigma=2.6e6$ S/m was assigned to the top of the PMMA. An inlet boundary condition was applied with 3056 randomly positioned particles per release with 1000 releases over a period of 32 ms. The particles had an initial kinetic energy of 100 keV. A normally distributed random velocity component normalized to 5% of the Z component velocity was applied in the X and Y directions. Electron interaction within the PMMA was modeled using particle matter interaction using a cutoff energy of 8.6 eV, with both nuclear stopping and ionization loss sub nodes. A cutoff screening angle of 0.1 degrees and an electronic stopping power of 4 (MeV $cm^2$)/g were used for each condition, respectively. Velocity reinitialization was also applied to the PMMA, with 40% likelihood of one secondary particle having an equal speed as the primary particle but a randomly chosen direction being released. Particle matter interaction was modeled in the quartz layer using nuclear stopping with a cutoff angle of 0.1 degrees. The electric currents (ec) module was applied with the substrate initially grounded to accurately portray current discharge by grounding the bottom of the substrate. Within this module, a 10 nm thick layer of conductive electrical shielding was used to model titanium.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A spiral inductor comprising:
a nitrogen vacancy diamond substrate;
a barrier layer of dielectric material on a surface of the nitrogen vacancy diamond substrate;
a spiral nanocoil comprising an electrically conductive material on a surface of the barrier layer of dielectric material;
an overlayer of dielectric material disposed over the spiral nanocoil;
a first electrode contact on a first end of the spiral nanocoil; and
a second electrode contact on a second end of the spiral nanocoil.

2. The spiral inductor of claim 1, wherein the spiral nanocoil has a turn spacing that is no larger than 500 nm.

3. The spiral inductor of claim 1, wherein the spiral nanocoil has a turn spacing that is no larger than 250 nm.

4. The spiral inductor of claim 1, wherein the spiral nanocoil has a diameter that is no greater than 100 μm.

5. The spiral inductor of claim 1, wherein the barrier layer of dielectric material has a thickness that is no greater than 3 μm.

6. The spiral inductor of claim 1, wherein the dielectric material of the barrier layer and the dielectric material of the overlayer are independently selected from silicon oxides and silicon nitrides.

7. The spiral inductor of claim 1, wherein the electrically conductive material is a titanium/gold bilayer.

8. The spiral inductor of claim 1, wherein the spiral nanocoil is an octahedral spiral coil having a turn spacing that is no larger than 400 nm and a diameter that is no greater than 100 μm, and the barrier layer of dielectric material has a thickness that is no greater than 3 μm.

9. A magnetic field detector comprising:
a spiral inductor comprising:
a nitrogen vacancy diamond substrate;
a barrier layer of dielectric material on a surface of the nitrogen vacancy diamond substrate;

a spiral nanocoil comprising an electrically conductive material on a surface of the barrier layer of dielectric material;
an overlayer of dielectric material disposed over the spiral nanocoil;
a first electrode contact on a first end of the spiral nanocoil; and
a second electrode contact on a second end of the spiral nanocoil;
an optical excitation source positioned to direct excitation radiation onto the nitrogen vacancy diamond substrate and the spiral nanocoil; and
an optical detector positioned to detect a fluorescence signal generated by the nitrogen vacancy diamond.

10. The magnetic field sensor of claim 9, wherein the optical excitation source is a green light-emitting laser or light-emitting diode and the optical detector is a photon detector that detects red light.

11. The magnetic field sensor of claim 10, comprising the green light-emitting laser, wherein the green light-emitting laser is a pulsed laser.

12. The magnetic field sensor of claim 9, further comprising a microwave source configured to apply a microwave signal to the nitrogen vacancy diamond substrate.

13. The magnetic field sensor of claim 12, further comprising a static magnetic field generator positioned to apply a bias magnetic field across the surface of the nitrogen vacancy diamond substrate.

14. A method of detecting a magnetic field generated by the spiral nanocoil in the magnetic field detector of claim 9, the method comprising:
directing excitation radiation from the optical excitation source onto the surface of the nitrogen vacancy diamond substrate and the spiral nanocoil, whereby the nitrogen vacancy diamond emits fluorescence having an intensity that is modulated by the magnetic field generated by the spiral nanocoil; and
monitoring the fluorescence using the optical detector.

15. A method of fabricating a spiral inductor, the method comprising:
depositing a barrier layer of dielectric material on a surface of a nitrogen vacancy diamond substrate;
forming a layer of an electron-beam resist on a surface of the barrier layer of dielectric material;
defining a spiral nanocoil pattern in the layer of the electron-beam resist using positive electron-beam lithography;
depositing an electrically conductive material in the spiral nanocoil pattern to form a spiral nanocoil comprising the electrically conductive material on the surface of the barrier layer of dielectric material;
removing the remaining electron-beam resist from the surface of the barrier layer of dielectric material;
depositing an overlayer of dielectric material over the spiral nanocoil;
forming a first electrode contact on a first end of the spiral nanocoil; and
forming a second electrode contact on a second end of the spiral nanocoil.

16. The method of claim 15, wherein the electron-beam resist is poly(methyl methacrylate).

17. The method of claim 16, wherein the positive electron-beam lithography is carried out with an electron beam dose in the range from 640 μC/cm² to 1600 μC/cm² and the spiral nanocoil has a turn spacing that is no larger than 500 nm and a diameter of less than 1 μm.

\* \* \* \* \*